US011424264B2

(12) United States Patent
Kim et al.

(10) Patent No.: US 11,424,264 B2
(45) Date of Patent: Aug. 23, 2022

(54) THREE-DIMENSIONAL SEMICONDUCTOR DEVICES

(71) Applicant: Samsung Electronics Co., Ltd., Suwon-si (KR)

(72) Inventors: Jung-Hwan Kim, Seoul (KR); Sunggil Kim, Yongin-si (KR); Dongkyum Kim, Suwon-si (KR); Seulye Kim, Seoul (KR); Ji-Hoon Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 16/838,586

(22) Filed: Apr. 2, 2020

(65) Prior Publication Data

US 2021/0043647 A1 Feb. 11, 2021

(30) Foreign Application Priority Data

Aug. 9, 2019 (KR) .......................... 10-2019-0097697

(51) Int. Cl.
*H01L 21/00* (2006.01)
*H01L 27/11582* (2017.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC ......... H01L 27/11582; H01L 27/11565; H01L 27/1157; H01L 27/11573; H01L 29/04; H01L 29/42344; H01L 29/7926
See application file for complete search history.

(56) References Cited

U.S. PATENT DOCUMENTS 5,350,698 A * 9/1994 Huang ................ H01L 29/6659
427/255.18
5,393,687 A * 2/1995 Liang ................ H01L 21/28525
438/564
(Continued)

FOREIGN PATENT DOCUMENTS

KR 1020150067811 A 6/2015
KR 1020170112292 A 10/2017
KR 1020180047639 A 5/2018

OTHER PUBLICATIONS

Mutsumi Kimura et al., Device Simulation of Carrier Transport through Grain Boundaries in Lightly Doped Polysilicon Films and Dependence on Dopant Density, Jpn.J.Appl. Phys. vol.40(2001)Pt. 1.No.1.

(Continued)

*Primary Examiner* — Richard A Booth
(74) *Attorney, Agent, or Firm* — Harness, Dickey & Pierce, P.L.C.

(57) ABSTRACT

A three-dimensional semiconductor memory device is disclosed. The device may include a first source conductive pattern comprising a polycrystalline material including first crystal grains on a substrate, the substrate may comprising a polycrystalline material including second crystal grains, a grain size of the first crystal grains being smaller than a grain size of the second crystal grains, a stack including a plurality of gate electrodes, the plurality of gates stacked on the first source conductive pattern, and a vertical channel portion penetrating the stack and the first source conductive pattern, and the vertical channel portion being in contact with a side surface of the first source conductive pattern.

20 Claims, 18 Drawing Sheets

(51) Int. Cl.
  *H01L 29/04*   (2006.01)
  *H01L 27/11565*   (2017.01)
  *H01L 29/792*   (2006.01)
  *H01L 27/11573*   (2017.01)
  *H01L 29/423*   (2006.01)
  *H01L 27/1157*   (2017.01)

(52) U.S. Cl.
  CPC ........ *H01L 27/11573* (2013.01); *H01L 29/04* (2013.01); *H01L 29/42344* (2013.01); *H01L 29/7926* (2013.01)

(56) References Cited

U.S. PATENT DOCUMENTS

| | | | |
|---|---|---|---|
| 5,441,904 A * | 8/1995 | Kim | H01L 21/28061 257/E21.2 |
| 6,150,251 A * | 11/2000 | Yew | H01L 21/28035 257/E29.155 |
| 9,356,043 B1 | 5/2016 | Sakakibara et al. | |
| 9,455,263 B2 | 9/2016 | Zhang et al. | |
| 9,627,395 B2 | 4/2017 | Zhang et al. | |
| 9,627,405 B1 | 4/2017 | Lee | |
| 9,805,805 B1 | 10/2017 | Zhang et al. | |
| 9,935,121 B2 | 4/2018 | Konagai et al. | |
| 9,985,098 B2 | 5/2018 | Matsumoto et al. | |
| 10,141,327 B2 | 11/2018 | Sonehara et al. | |
| 10,224,340 B2 | 3/2019 | Hada et al. | |
| 10,283,518 B2 | 5/2019 | Lee et al. | |
| 2002/0149064 A1 * | 10/2002 | Ballantine | H01L 21/28035 257/E21.197 |
| 2018/0122822 A1 | 5/2018 | Lee et al. | |

OTHER PUBLICATIONS

Zhenyu Wan et al., Rapid thermal annealing and crystallization mechanisms study of silicon nanocrystal in silicon carbide matrix, Nanoscale Research Letters Dec. 2011, 6129.

* cited by examiner

THREE-DIMENSIONAL SEMICONDUCTOR DEVICES

CROSS-REFERENCE TO RELATED APPLICATIONS

This U.S. non-provisional patent application claims priority under 35 U.S.C. § 119 to Korean Patent Application No. 10-2019-0097697, filed on Aug. 9, 2019, in the Korean Intellectual Property Office, the entire contents of which are hereby incorporated by reference.

BACKGROUND OF THE INVENTION

The present disclosure relates to a three-dimensional semiconductor memory device, and in particular, to a three-dimensional semiconductor memory device with improved reliability.

Developments in higher integration of semiconductor devices have been sought to satisfy consumer demands for superior performance and inexpensive prices. Since the integration of semiconductor devices is an important factor in determining product prices, increased integration is especially beneficial. In the case of two-dimensional or planar semiconductor devices, since their integration is mainly determined by the area occupied by a unit memory cell, integration is greatly influenced by the level of fine pattern forming technology. However, the extremely expensive process equipment needed to increase pattern fineness sets a practical limitation on increasing the integration for two-dimensional or planar semiconductor devices. Thus, three-dimensional semiconductor memory devices including three-dimensionally arranged memory cells have recently been proposed.

SUMMARY

An embodiment of the inventive concepts provides a three-dimensional semiconductor memory device with improved reliability.

According to an embodiment of the inventive concepts, a three-dimensional semiconductor memory device may include a first source conductive pattern comprising a polycrystalline material including first crystal grains, the first source conductive pattern on a substrate, the substrate comprising a polycrystalline material including second crystal grains, a grain size of the first crystal grains being smaller than a grain size of the second crystal grains, a stack including a plurality of gate electrodes, the plurality of gate electrodes stacked on the first source conductive pattern, and a vertical channel portion penetrating the stack and the first source conductive pattern, and the vertical channel portion being in contact with a side surface of the first source conductive pattern.

According to an embodiment of the inventive concepts, a three-dimensional semiconductor memory device may include a first source conductive pattern and a second source conductive pattern on a substrate, the first source conductive pattern comprising impurities not included in the second source conductive pattern, a stack including a plurality of gate electrodes stacked on the second source conductive pattern, and a vertical channel portion penetrating the stack and the first and second source conductive patterns and, the vertical channel portion being in contact with a side surface of the first source conductive pattern.

According to an embodiment of the inventive concepts, a three-dimensional semiconductor memory device may include a peripheral circuit structure on a first substrate, the peripheral circuit structure including peripheral circuit transistors, a second substrate on the peripheral circuit structure, a first source conductive pattern on the second substrate, the first source conductive pattern comprising first impurities and second impurities, the first impurities including n-type impurities, the second impurities comprising crystal growth suppressing elements for suppression of crystal growth in the first source conductive pattern, a stack including a plurality of gate electrodes stacked on the first source conductive pattern, a vertical channel portion penetrating the stack and first source conductive pattern and extending into the second substrate, the vertical channel portion being in contact with a side surface of the first source conductive pattern, and a charge storing layer interposed between the vertical channel portion and the stack.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. When the terms "about" or "substantially" are used in this specification in connection with a numerical value, it is intended that the associated numerical value include a tolerance of ±10% around the stated numerical value. When ranges are specified, the range includes all values therebetween such as increments of 0.1%. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
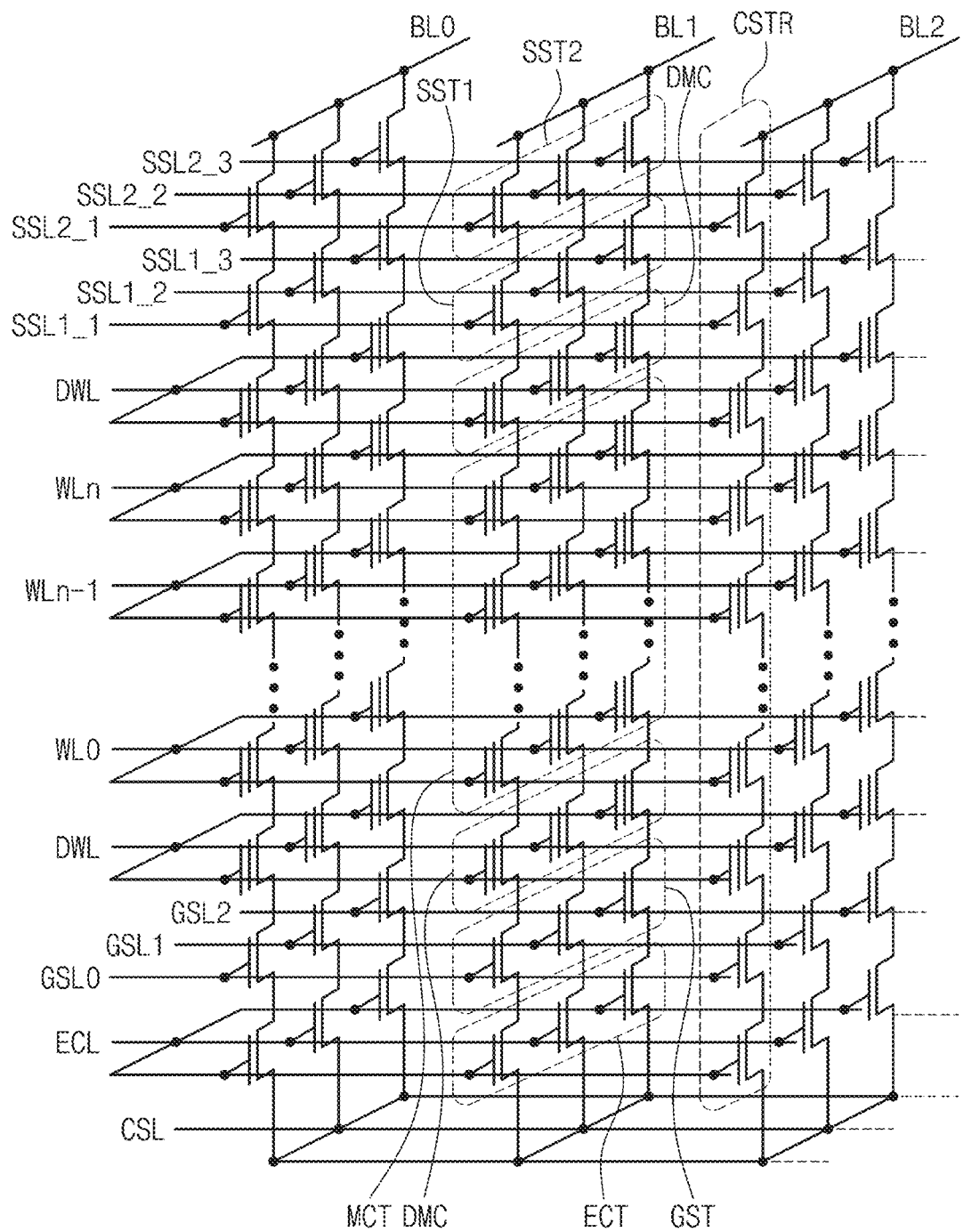
FIG. 1 is a circuit diagram illustrating a cell array of a three-dimensional semiconductor memory device according to an embodiment of the inventive concepts.

FIG. 1 is a circuit diagram illustrating a cell array of a three-dimensional semiconductor memory device according to an embodiment of the inventive concepts.

Referring to FIG. 1, a cell array of a three-dimensional semiconductor memory device may include a common source line CSL, a plurality of bit lines BL0-BL2, and a plurality of cell strings CSTR between the common source line CSL and the bit lines BL0-BL2.

The cell strings CSTR may be two-dimensionally arranged in first and second directions X and Y and may be extended in a third direction Z. In an embodiment, the bit lines BL0-BL2 may be spaced apart from each other in the first direction X and may be extended in the second direction Y.

A plurality of the cell strings CSTR may be connected in parallel to each of the bit lines BL0-BL2. The plurality of the cell strings CSTR may be connected in common to the common source line CSL. For example, the plurality of the cell strings CSTR may be between the plurality of the bit lines BL0-BL2 and one common source line CSL. A plurality of the common source lines CSL may be two-dimensionally arranged. The common source lines CSL may be applied with the same voltage or may be independently controlled.

In an embodiment, each of the cell strings CSTR may include string selection transistors SST1 and SST2 connected in series to each other, memory cell transistors MCT connected in series to each other, a ground selection transistor GST, and an erase control transistor ECT. Each of the memory cell transistors MCT may include a data storage element.

As an example, each of the cell strings CSTR may include the first and second string selection transistors SST1 and SST2 connected in series, and the second string selection transistor SST2 may be coupled to one of the bit lines BL0-BL2. As another example, each of the cell strings CSTR may include one string selection transistor. As other example, in each of the cell strings CSTR, the ground selection transistor GST may be composed of a plurality of metal-oxide-semiconductor (MOS) transistors connected in series, similar to the first and second string selection transistors SST1 and SST2.

Each of the cell strings CSTR may include a plurality of the memory cell transistors MCT located at different heights from the common source lines CSL. The memory cell transistors MCT may be connected in series, between the first string selection transistor SST1 and the ground selection transistor GST. The erase control transistor ECT may be provided between and connected to the ground selection transistor GST and the common source line CSL. In addition, each of the cell strings CSTR may include dummy cell transistors DMC provided between the first string selection transistor SST1 and the uppermost one of the memory cell transistors MCT and between the ground selection transistor GST and the lowermost one of the memory cell transistors MCT and are connected to them.

In an embodiment, the first string selection transistor SST1 may be controlled by one of first string selection lines SSL1_1, SSL1_2, and SSL1_3, and the second string selection transistor SST2 may be controlled by one of second string selection lines SSL2_1, SSL2_2, and SSL2_3. The memory cell transistors MCT may be controlled by a plurality of word lines WL0-WLn, respectively, and the dummy cell transistors DMC may be controlled by dummy word lines DWL, respectively. The ground selection transistor GST may be controlled by one of ground selection lines GSL0, GSL1, and GSL2, and the erase control transistor ECT may be controlled by an erase control line ECL. The common source line CSL may be connected in common to sources of the erase control transistors ECT.

Gate electrodes of the memory cell transistors MCT located at substantially the same height from the common source lines CSL may be connected in common to one of the word lines WL0-WLn and the dummy word lines DWL and may be in an equipotential state. Alternatively, even when the gate electrodes of the memory cell transistors MCT are located at substantially the same height from the common source lines CSL, the gate electrodes constituting different rows or columns may be independently controlled.

The ground selection lines GSL0-GSL2 and the first and second string selection lines SSL1_1, SSL1_2, SSL1_3, SSL2_1, SSL2_2, and SSL2_3 may be extended in the first direction X and may be spaced apart from each other in the second direction Y. The ground selection lines GSL0-GSL2 and the first and second string selection lines SSL1_1, SSL1_2, SSL1_3, SSL2_1, SSL2_2, and SSL2_3, located at substantially the same height from the common source lines CSL, may be electrically separated from each other. In addition, the erase control transistors ECT in different ones of the cell strings CSTR may be simultaneously controlled by the erase control line ECL. During an erase operation of the memory cell array, the erase control transistors ECT may cause a gate induced drain leakage (GIDL).

Figure 2:
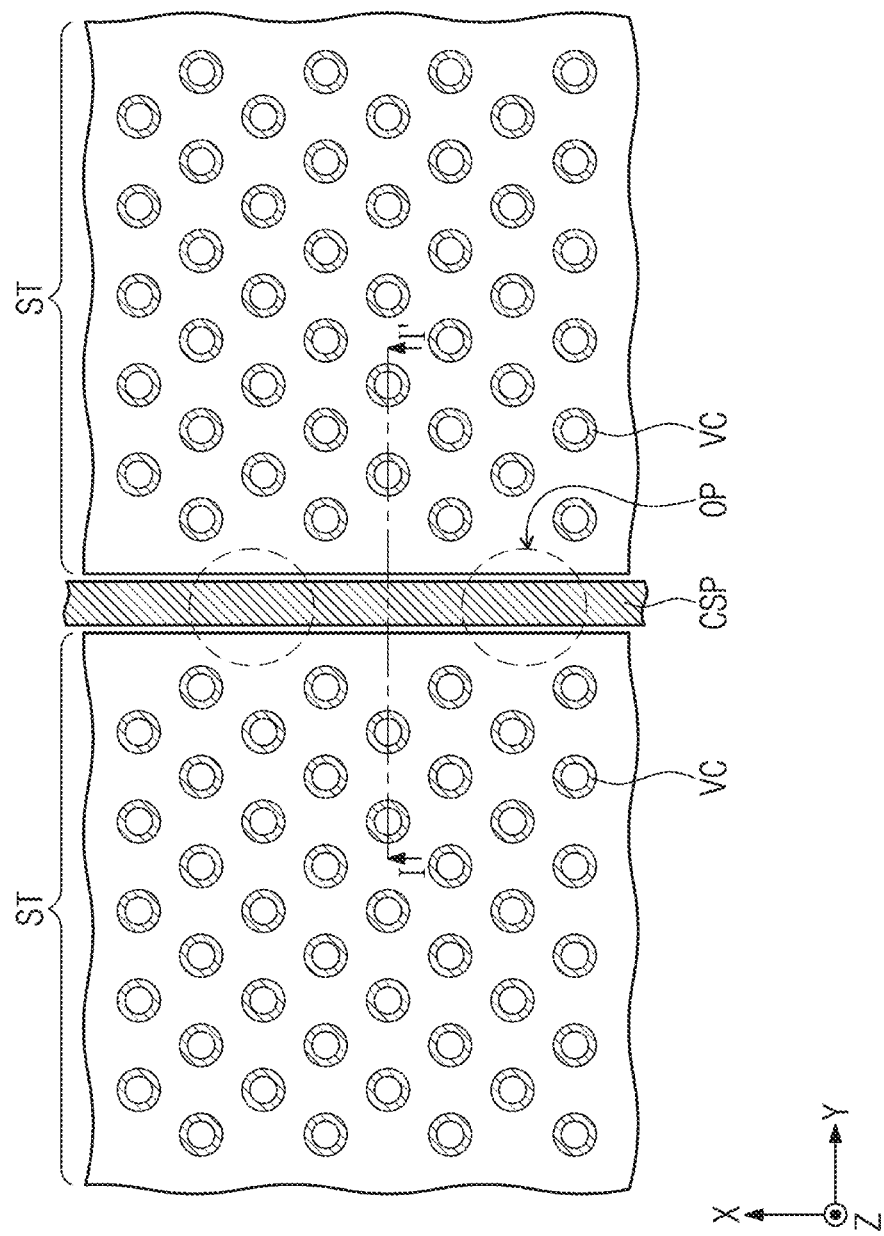
FIG. 2 is a plan view illustrating a three-dimensional semiconductor memory device according to an embodiment of the inventive concepts.
Figure 3:
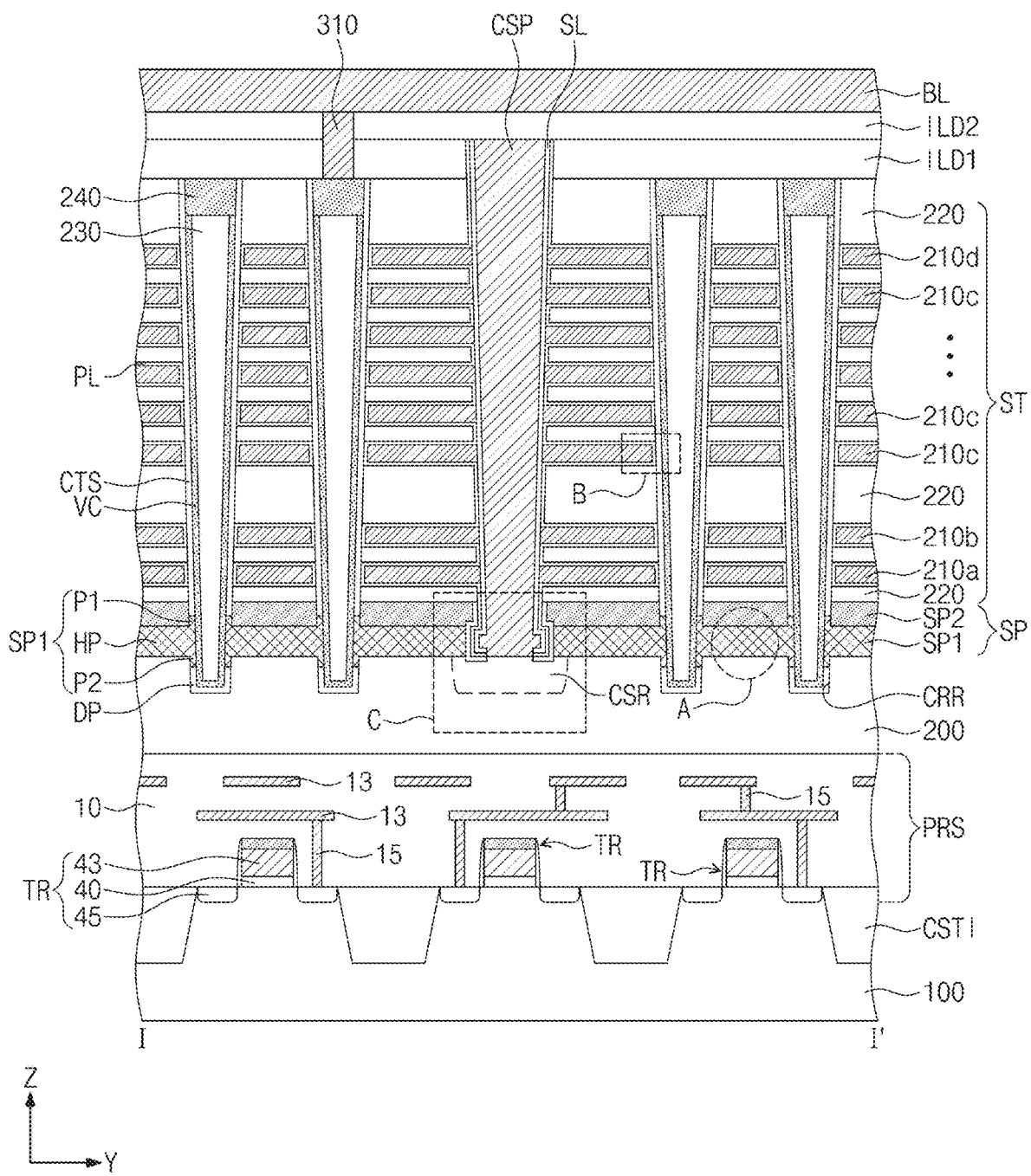
FIG. 3 is a sectional view taken along a line I-I' of FIG. 2 to illustrate a three-dimensional semiconductor memory device according to an embodiment of the inventive concepts.
Figure 4A:
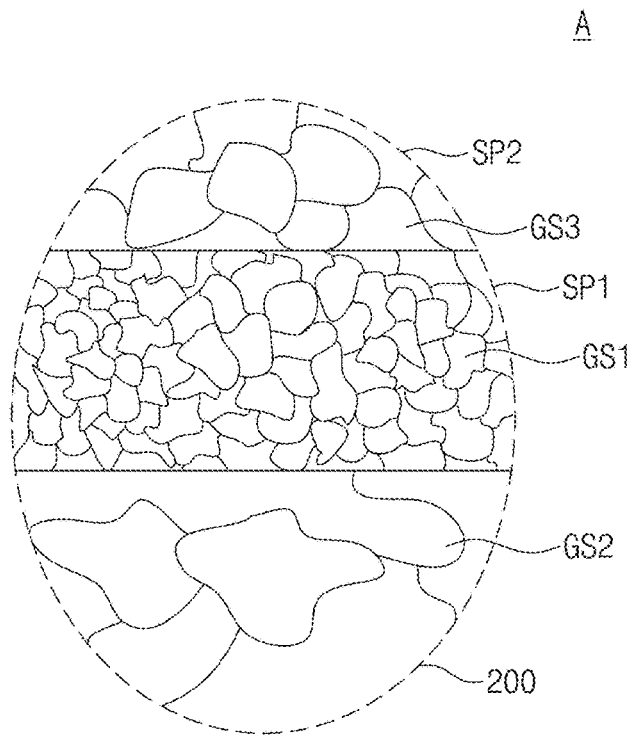
FIG. 4A is an enlarged sectional view of a portion 'A' of FIG. 3.
Figure 4B:
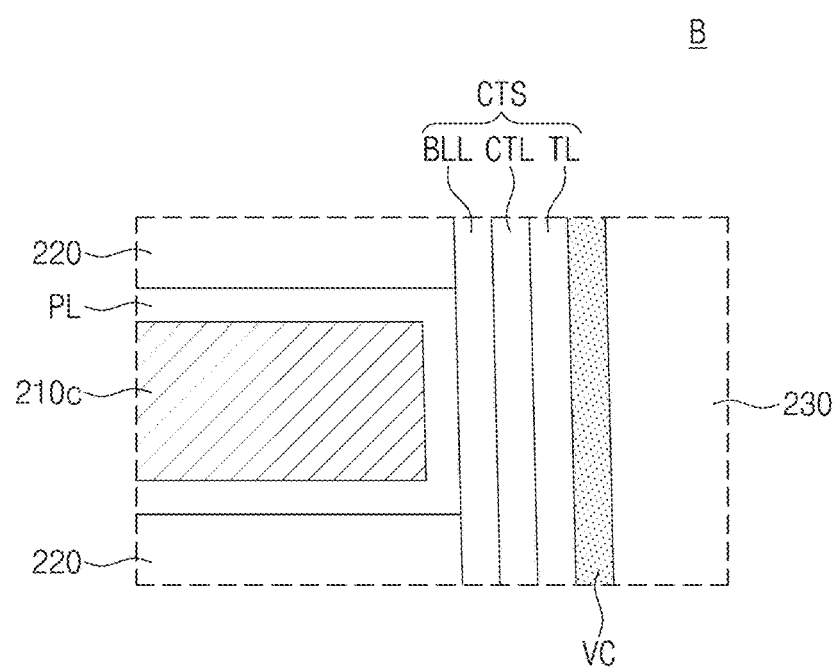
FIG. 4B is an enlarged sectional view of a portion 'B' of FIG. 3.
Figure 4C:
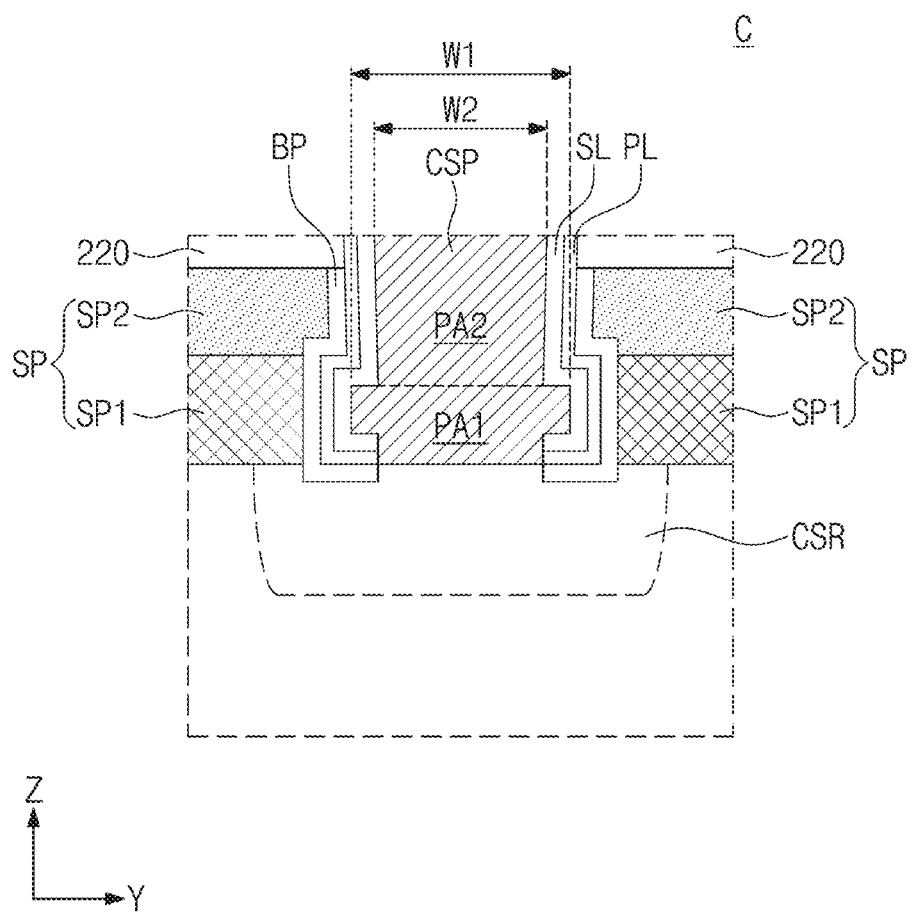
FIG. 4C is an enlarged sectional view of a portion 'C' of FIG. 3.

FIG. 2 is a plan view illustrating a three-dimensional semiconductor memory device according to an embodiment of the inventive concepts. FIG. 3 is a sectional view taken along a line I-I' of FIG. 2 to illustrate a three-dimensional semiconductor memory device according to an embodiment of the inventive concepts. FIG. 4A is an enlarged sectional view of a portion 'A' of FIG. 3. FIG. 4B is an enlarged sectional view of a portion 'B' of FIG. 3. FIG. 4C is an enlarged sectional view of a portion 'C' of FIG. 3.

Referring to FIGS. 2 and 3, a three-dimensional semiconductor memory device may include a lower substrate 100, a peripheral circuit structure PRS, a source structure SP, stacks ST, and vertical channel portions VC. The lower substrate 100 may be a silicon substrate, a silicon-germanium substrate, a germanium substrate, or a single-crystalline epitaxial layer grown on a single-crystalline silicon substrate. The lower substrate 100 may be formed of a single crystalline semiconductor material (e.g., single crystalline silicon). The peripheral circuit structure PRS may include peripheral circuit transistors TR, a peripheral circuit interlayered insulating layer 10, interconnection lines 13, and vias 15. A cell device isolation layer CSTI may be in the lower substrate 100, and the peripheral circuit transistors TR may be on active regions of the lower substrate 100 defined by the cell device isolation layer CSTI. Each of the peripheral circuit transistors TR may include a peripheral gate insulating layer 40, a peripheral gate electrode 43, and source/drain regions 45. The peripheral circuit interlayered insulating layer 10 may be on the lower substrate 100. The peripheral circuit interlayered insulating layer 10 may be to cover the peripheral circuit transistors TR. The interconnection lines 13 and the vias 15 may be in the peripheral circuit interlayered insulating layer 10. The interconnection lines 13 located at different levels, may be electrically connected to each other through the vias 15 therebetween. In addition, the peripheral circuit transistors TR may be electrically connected to the interconnection lines 13 through the vias 15.

A substrate 200 may be on the peripheral circuit structure PRS. The substrate 200 may be formed of or include at least one of silicon, silicon-germanium, or germanium. In an embodiment, the substrate 200 may be formed of a polycrystalline semiconductor material (e.g., poly silicon). The substrate 200 may be doped with n-type impurities (e.g., phosphorus). The source structure SP may be on the substrate 200. The source structure SP may include a first source conductive pattern SP1 and a second source conductive pattern SP2 sequentially stacked on the substrate 200. The first source conductive pattern SP1 may be in contact with a top surface of the substrate 200. The first source conductive pattern SP1 may have openings OP. The openings OP may be between the stacks ST placed adjacent to each other in the second direction Y. The openings OP may be spaced apart from each other in the first direction X or in a direction crossing the second direction Y. Although not illustrated in the drawings, portions of the top surface of the substrate 200 may be exposed through the openings OP.

The first source conductive pattern SP1 may be formed of a polycrystalline semiconductor material (e.g., poly silicon). In an embodiment, the first source conductive pattern SP1 may include one kind of impurity. The impurity may be an n-type element (e.g., phosphorus). In another embodiment, the first source conductive pattern SP1 may include two or more kinds of impurities. For example, the first source conductive pattern SP1 may include first impurities and second impurities. The first impurities may be elements, which do not form a compound with elements in the first source conductive pattern SP1 (e.g., silicon). The second impurities may be elements, which can form a compound with elements in the first source conductive pattern SP1 (e.g., silicon). For example, the first impurities may include n-type elements (e.g., phosphorus). The second impurities may include at least one of, for example, carbon (C), nitrogen (N), oxygen (O), chlorine (Cl), bromine (Br), or any combination thereof. In an embodiment, as shown in FIG. 4A, a grain size of crystal grains GS1 of the first source conductive pattern SP1 may be smaller than a grain size of crystal grains GS2 of the substrate 200 (e.g., grain size(GS1)<grain size(GS2)). The grain size may be, for example, an average grain size of the crystal grains measured in an arbitrary section of the material or an average of the measurements from arbitrary sections, or may be the grain size of a representative crystal grain found at an arbitrary section of the material. A ratio of the grain size of the crystal grains GS1 of the first source conductive pattern SP1 to the grain size of the crystal grains GS2 of the substrate 200 may range from about 0.1 to about 0.01. In an embodiment, the grain size of the crystal grains GS1 of the first source conductive pattern SP1 may be smaller than about 10 nm.

The second source conductive pattern SP2 may be on the first source conductive pattern SP1. The second source conductive pattern SP2 may be formed of a polycrystalline semiconductor material (e.g., poly silicon). The second source conductive pattern SP2 may be in contact with a top surface of the first source conductive pattern SP1. The second source conductive pattern SP2 may be extended to cover side surfaces of the openings OP of the first source conductive pattern SP1. The second source conductive pattern SP2 may contain no impurities or may contain at least one kind of impurity. In this case, the first source conductive pattern SP1 may include impurities that are not included in the second source conductive pattern SP2. The second source conductive pattern SP2 may contain n-type impurities. The concentration of the n-type impurities may be higher in the first source conductive pattern SP1 than in the second source conductive pattern SP2. In an embodiment, a grain size of crystal grains GS3 of the second source conductive pattern SP2 may be larger than the grain size of the crystal grains GS1 of the first source conductive pattern SP1 (e.g., grain size(GS1)<grain size(GS3)). The grain size of the crystal grains GS3 of the second source conductive pattern SP2 may be smaller than the grain size of the crystal grains GS2 of the substrate 200 (e.g., grain size(GS3)<grain size(GS2)).

The stacks ST may be on the source structure SP. The stacks ST may be extended in the first direction X and may be spaced apart from each other in the second direction Y. Each of the stacks ST may include gate electrodes 210a, 210b, 210c, and 210d and insulating patterns 220. The gate electrodes 210a, 210b, 210c, and 210d and the insulating patterns 220 may be alternately and repeatedly stacked on the source structure SP. The gate electrodes 210a, 210b, 210c, and 210d may include an erase gate electrode 210a, a ground selection gate electrode 210b, cell gate electrodes 210c, and a string selection gate electrode 210d.

The erase gate electrode 210a may be on the source structure SP. The erase gate electrode 210a may be adjacent to the source structure SP. The erase gate electrode 210a may be the lowermost electrode of the gate electrodes 210a, 210b, 210c, and 210d. The erase gate electrode 210a may correspond to the erase control transistors ECT as shown in FIG. 1 and be used to induce the gate-induced drain leakage (GIDL) during the erase operation of the memory cell array. The ground selection gate electrode 210b may be on the erase gate electrode 210a. In another embodiment, the ground selection gate electrode 210b may be adjacent to the erase gate electrode 210a. The ground selection gate electrode 210b may correspond to the ground selection lines GSL0-GSL2 shown in FIG. 1. The string selection gate electrode 210d may be on the ground selection gate electrode 210b. The string selection gate electrode 210d may be the uppermost electrode of the gate electrodes 210a, 210b, 210c, and 210d. The string selection gate electrode 210d may correspond to one of the first and second string selection lines SSL1_1, SSL1_2, SSL1_3, SSL2_1, SSL2_2, and SSL2_3 of FIG. 1. The cell gate electrodes 210c may be between the ground selection gate electrode 210b and the string selection gate electrode 210d. The cell gate electrodes 210c may correspond to the word lines WL0-WLn of FIG. 1.

The insulating patterns 220 may be between the gate electrodes 210a, 210b, 210c, and 210d adjacent to each other in the third direction Z perpendicular to the top surface of the substrate 200, between the erase gate electrode 210a and the source structure SP, and on the string selection gate electrode 210d. Some of the insulating patterns 220 may be between the ground selection gate electrode 210b and the lowermost electrode of the cell gate electrodes 210c and on the string selection gate electrode 210d may be thicker than the remaining ones of the insulating patterns 220.

The vertical channel portions VC may penetrate the stacks ST and the source structure SP. The vertical channel portions VC may be extended into the substrate 200. For example, the vertical channel portions VC may be in channel recess regions CRR of the substrate 200. The channel recess regions CRR may be regions recessed from the top surface of the substrate 200. The vertical channel portions VC may be physically spaced apart from the substrate 200. The vertical channel portions VC may be in contact with side surfaces of the first source conductive pattern SP1 and may be spatially spaced apart from side surfaces of the second source conductive pattern SP2. The vertical channel portions VC may be electrically connected to the substrate 200 through the source structure SP. The vertical channel portions VC may have a pipe or macaroni shape whose bottom is closed. The vertical channel portions VC may be formed of or include at least one of a semiconductor material (e.g., silicon (Si) and/or germanium (Ge)). In addition, the vertical channel portions VC may be formed of a doped or undoped (i.e., intrinsic) semiconductor material. The vertical channel portions VC may be formed of or include a polycrystalline semiconductor material.

The first source conductive pattern SP1 may include a horizontal portion HP, a first protruding portion P1, and a second protruding portion P2. The horizontal portion HP may be between the substrate 200 and the second source conductive pattern SP2. The first protruding portion P1 may be between a portion of an outer side surface of each of the vertical channel portions VC and a portion of the side surface of the second source conductive pattern SP2, and the second protruding portion P2 may be between a portion of the outer side surface of each of the vertical channel portions VC and a portion of a side surface of each of the channel recess regions CRR of the substrate 200. The horizontal portion HP may be interposed between the substrate 200 and the first source conductive pattern SP1 and between the first and second protruding portions P1 and P2. The first protruding portion P1 may be a portion of the first source conductive pattern SP1, which is extended from the horizontal portion HP to a region between a portion of the outer side surface of the vertical channel portion VC and a portion of the side surface of the second source conductive pattern SP2, and the second protruding portion P2 may be a portion of the first source conductive pattern SP1, which is extended from the horizontal portion HP to a region between a portion of the outer side surface of the vertical channel portion VC and a portion of the side surface of the channel recess region CRR.

A charge storing structure CTS may be on a top surface of the first protruding portion P1 of the first source conductive pattern SP1 to enclose the outer side surface of the vertical channel portion VC. The charge storing structure CTS may be interposed between the gate electrodes 210a, 210b, 210c, and 210d and the vertical channel portion VC and may be extended in the third direction Z to enclose the outer side surface of the vertical channel portion VC. The charge storing structure CTS may be on a portion of the side surface of the second source conductive pattern SP2, which is not covered with the first source conductive pattern SP1. Referring to FIG. 4B, the charge storing structure CTS may include a tunnel insulating layer TL, a blocking insulating layer BLL, and a charge storing layer CTL. The tunnel insulating layer TL may be adjacent to the vertical channel portion VC and may enclose the outer side surface of the vertical channel portion VC. The blocking insulating layer BLL may be adjacent to the gate electrodes 210a, 210b, 210c, and 210d. The charge storing layer CTL may be between the tunnel insulating layer TL and the blocking insulating layer BLL. The tunnel insulating layer TL may be formed of or include at least one of, for example, silicon oxide and/or a high-k dielectric material (e.g., aluminum oxide ($Al_2O_3$) and hafnium oxide ($HfO_2$)). The blocking insulating layer BLL may be formed of or include at least one of, for example, silicon oxide and/or a high-k dielectric material (e.g., aluminum oxide ($Al_2O_3$) and hafnium oxide ($HfO_2$)). The charge storing layer CTL may be formed of or include, for example, a silicon nitride layer.

A gap-fill layer 230 may be in an internal space, which is defined in the vertical channel portion VC. The gap-fill layer 230 may be formed of or include at least one of, for example, silicon oxide, silicon nitride, or silicon oxynitride. A pad 240 may be on top surfaces of the vertical channel portion VC and the gap-fill layer 230. The pad 240 may be formed of or include a conductive material or a doped semiconductor material having a different conductivity type from the vertical channel portion VC.

A dummy pattern DP may be in each of the channel recess regions CRR. The dummy pattern DP may enclose a lower side surface and a bottom surface of the vertical channel portion VC in the channel recess region CRR. The dummy pattern DP may be in contact with a bottom surface of the second protruding portion P2 of the first source conductive pattern SP1. The dummy pattern DP may be vertically separated from the charge storing structure CTS. The dummy pattern DP may have substantially the same stacking structure as the charge storing structure CTS. For example, the dummy pattern DP may include the same layers as those stacked in the charge storing structure CTS. In an embodiment, the dummy pattern DP may include a first stacking layer, which is formed of or includes at least one of silicon oxide and/or a high-k dielectric material (e.g., aluminum oxide ($Al_2O_3$) and hafnium oxide ($HfO_2$)), a second stacking layer, which is formed of or includes silicon nitride, and a third stacking layer, which is formed of or includes at least one of silicon oxide and/or a high-k dielectric material (e.g., aluminum oxide ($Al_2O_3$) and hafnium oxide ($HfO_2$)).

A first interlayered insulating layer ILD1 may cover the top surfaces of the stacks ST. The first interlayered insulating layer ILD1 may cover top surfaces of the pads 240 and a top surface of the uppermost pattern of the insulating patterns 220. The first interlayered insulating layer ILD1 may be formed of or include, for example, silicon oxide.

A common source pattern CSP may penetrate the first interlayered insulating layer ILD1 and may be between stacks ST adjacent to each other in the second direction Y. The common source pattern CSP between the stacks ST may be extended in the first direction X. The common source pattern CSP may be extended into the openings OP (e.g., see FIG. 2) to be in contact with portions of the substrate 200 below the openings OP. The common source pattern CSP may penetrate the source structure SP, and a portion of a bottom surface of the common source pattern CSP may be in contact with the substrate 200. Referring to FIG. 4C, a width W1 of a first portion PA1 of the common source pattern CSP, which is located between the first source conductive patterns SP1 adjacent to each other in the second direction Y, may be larger than a width W2 of a second portion PA2 of the common source pattern CSP, which is located between the second source conductive patterns SP2 adjacent to each other in the second direction Y. For example, the first portion PA1 may be a portion of the common source pattern CSP with a sidewall laterally extended relative to a side surface of the second portion PA2 of the common source pattern CSP. The common source pattern CSP may be formed of or include at least one of, for example, a conductive material (e.g., tungsten, copper, and/or aluminum) and/or a metal nitride (e.g., titanium nitride and/or tantalum nitride). A spacer SL may be between the common source pattern CSP and the stacks ST and between the source structure SP and the common source pattern CSP. The spacer SL may enclose a side surface of the common source pattern CSP. The spacer SL may be interposed between a portion of the top surface of the substrate 200 and a portion of a bottom surface of the common source pattern CSP. The spacer SL may be formed of or include at least one of, for example, an insulating material (e.g., silicon oxide and/or silicon nitride).

A common source region CSR may be in a region of the substrate 200 located below the common source pattern CSP. The common source region CSR may be provided in a region of the substrate 200, which is located between the stacks ST adjacent to each other in the second direction Y. The common source pattern CSP may have a different conductivity type from that of the substrate 200.

A blocking pattern BP may be between the source structure SP and the spacer SL. The blocking pattern BP may extend into a region between the substrate 200 and a portion of the spacer SL on the top surface of the substrate 200. The blocking pattern BP may be formed of or include, for example, silicon oxide. A horizontal insulating layer PL may be between the gate electrodes 210a, 210b, 210c, and 210d and the charge storing structure CTS and may be extended to cover top and bottom surfaces of the gate electrodes 210a, 210b, 210c, and 210d. The horizontal insulating layer PL may be extended to be interposed between the insulating patterns 220 and the spacer SL and between the blocking pattern BP and the spacer SL. The horizontal insulating layer PL may be formed of or include at least one of, for example, silicon oxide (e.g., $SiO_2$) and/or a high-k dielectric material (e.g., aluminum oxide ($Al_2O_3$) and hafnium oxide ($HfO_2$)).

A second interlayered insulating layer ILD2 may be on the first interlayered insulating layer ILD1 and the common source pattern CSP. The second interlayered insulating layer ILD2 may be formed of or include, for example, silicon oxide. Channel contact plugs 310 may be on the pads 240. The channel contact plugs 310 may be provided to penetrate the first and second interlayered insulating layers ILD1 and ILD2 and may be electrically connected to the pads 240. Bit lines BL may be on the second interlayered insulating layer ILD2. The bit lines BL may extend in the second direction Y and may cross the stacks ST. The bit lines BL may be spaced apart from each other in the first direction X. The bit lines BL may be electrically connected to the channel contact plugs 310.

Figure 5:
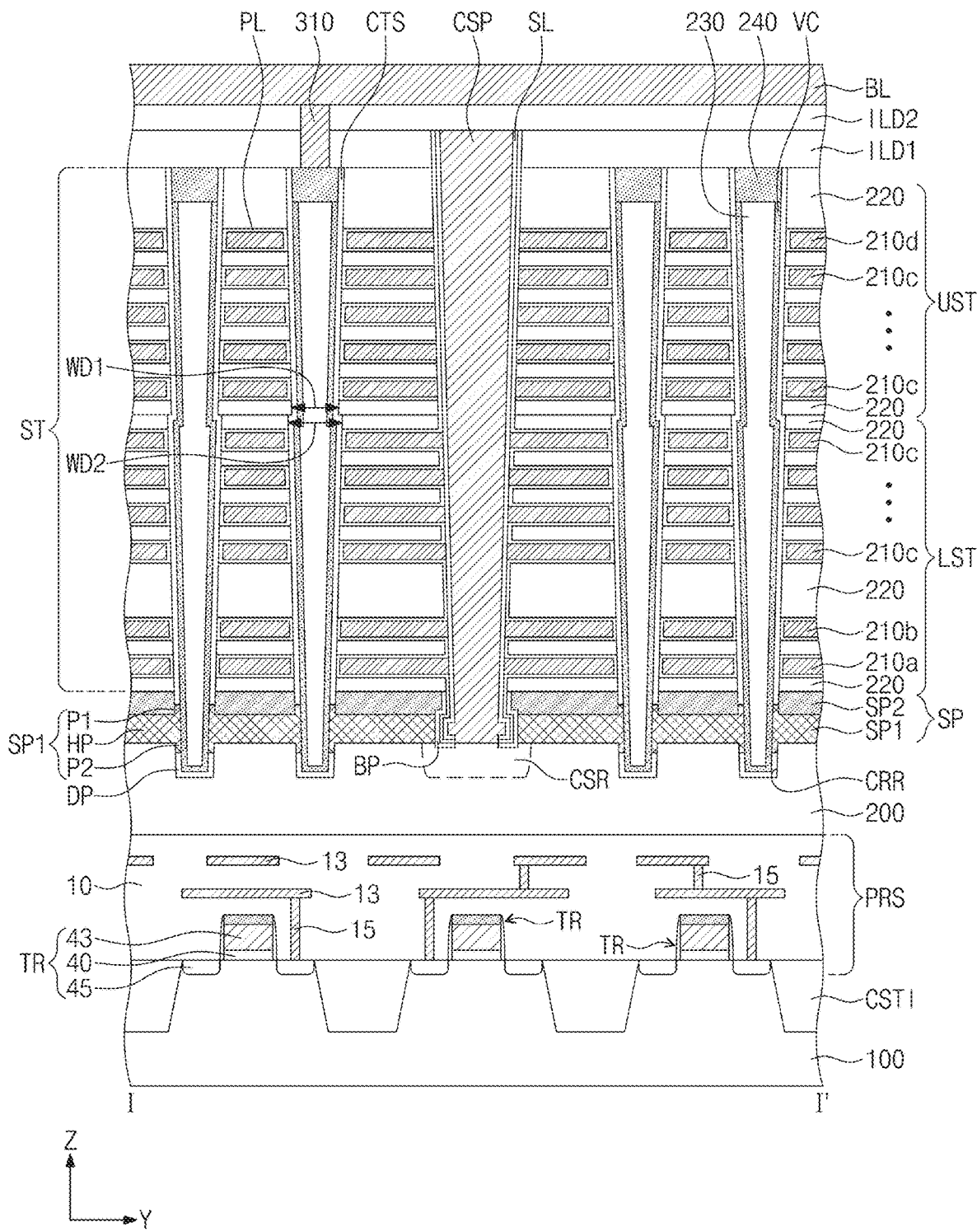
FIG. 5 is a sectional view taken along a line I-I' of FIG. 2 to illustrate a three-dimensional semiconductor memory device according to an embodiment of the inventive concepts.

FIG. 5 is a sectional view taken along a line I-I' of FIG. 2 to illustrate a three-dimensional semiconductor memory device according to an embodiment of the inventive concepts.

Referring to FIG. 5, a three-dimensional semiconductor memory device may include the lower substrate 100, the peripheral circuit structure PRS, the substrate 200, the source structure SP, the stacks ST, and the vertical channel portions VC. Each of the stacks ST may include a lower stack LST and an upper stack UST. The source structure SP may be between the lower stack LST and the substrate 200. The lower stack LST may include the erase gate electrode 210a, the ground selection gate electrode 210b on the erase gate electrode 210a, the cell gate electrodes 210c on the ground selection gate electrode 210b, and the insulating patterns 220. The erase, ground selection, and cell gate electrodes 210a, 210b, and 210c and the insulating patterns 220 of the lower stack LST may be alternately and repeatedly stacked in the third direction Z. The cell gate electrodes 210c of the lower stack LST may be sequentially stacked on the ground selection gate electrode 210b. The erase gate electrode 210a may correspond to the lowermost gate electrode of the lower stack LST, and the uppermost electrode of the cell gate electrodes 210c may correspond to the uppermost gate electrode of the lower stack LST. The vertical channel portions VC in the lower stack LST, the charge storing structures CTS, and the pads 240 may be substantially the same as those described with reference to FIG. 2, and thus, the detailed descriptions thereof will be omitted, for the sake of brevity.

The upper stack UST may be on the lower stack LST. The upper stack UST may include the cell gate electrodes 210c, the string selection gate electrode 210d, and the insulating patterns 220. The cell and string selection gate electrodes 210c and 210d and the insulating patterns 220 of the upper stack UST may be alternately and repeatedly stacked in the third direction Z. The cell gate electrodes 210c of the upper stack UST may be sequentially stacked on the lower stack LST, and the string selection gate electrode 210d may be on the uppermost electrode of the cell gate electrodes 210c of the upper stack UST. The lowermost electrode of the cell gate electrodes 210c of the upper stack UST may correspond to the lowermost gate electrode of the upper stack UST, and the string selection gate electrode 210d may correspond to the uppermost gate electrode of the upper stack UST.

The vertical channel portions VC may penetrate the lower stack LST and the upper stack UST. Each of the vertical channel portions VC may include a lower portion penetrating the lower stack LST and an upper portion penetrating the upper stack UST. A bottom width WD1 of the upper portion of the vertical channel portion VC may be smaller than a top width WD2 of the lower portion of the vertical channel portion VC. For example, a side surface of the upper portion of the vertical channel portion VC may be misaligned to a side surface of the lower portion of the vertical channel portion VC. Each of the charge storing structures CTS may conformally enclose the outer side surface of each of the vertical channel portions VC. The gap-fill layers 230 may be provided to fill internal spaces of the vertical channel portions VC, and the pads 240 may be on the top surfaces of the vertical channel portions VC and the gap-fill layers 230. The first interlayered insulating layer ILD1, the second interlayered insulating layer ILD2, and the bit lines BL may be sequentially on the upper stack UST.

The common source pattern CSP may be extended to penetrate the upper stack UST, the lower stack LST, and the source structure SP. A top surface of the common source pattern CSP may be coplanar with a top surface of the uppermost pattern of the insulating patterns 220 of the upper stack UST. The spacer SL may be on the side surface of the common source pattern CSP.

Figure 6:
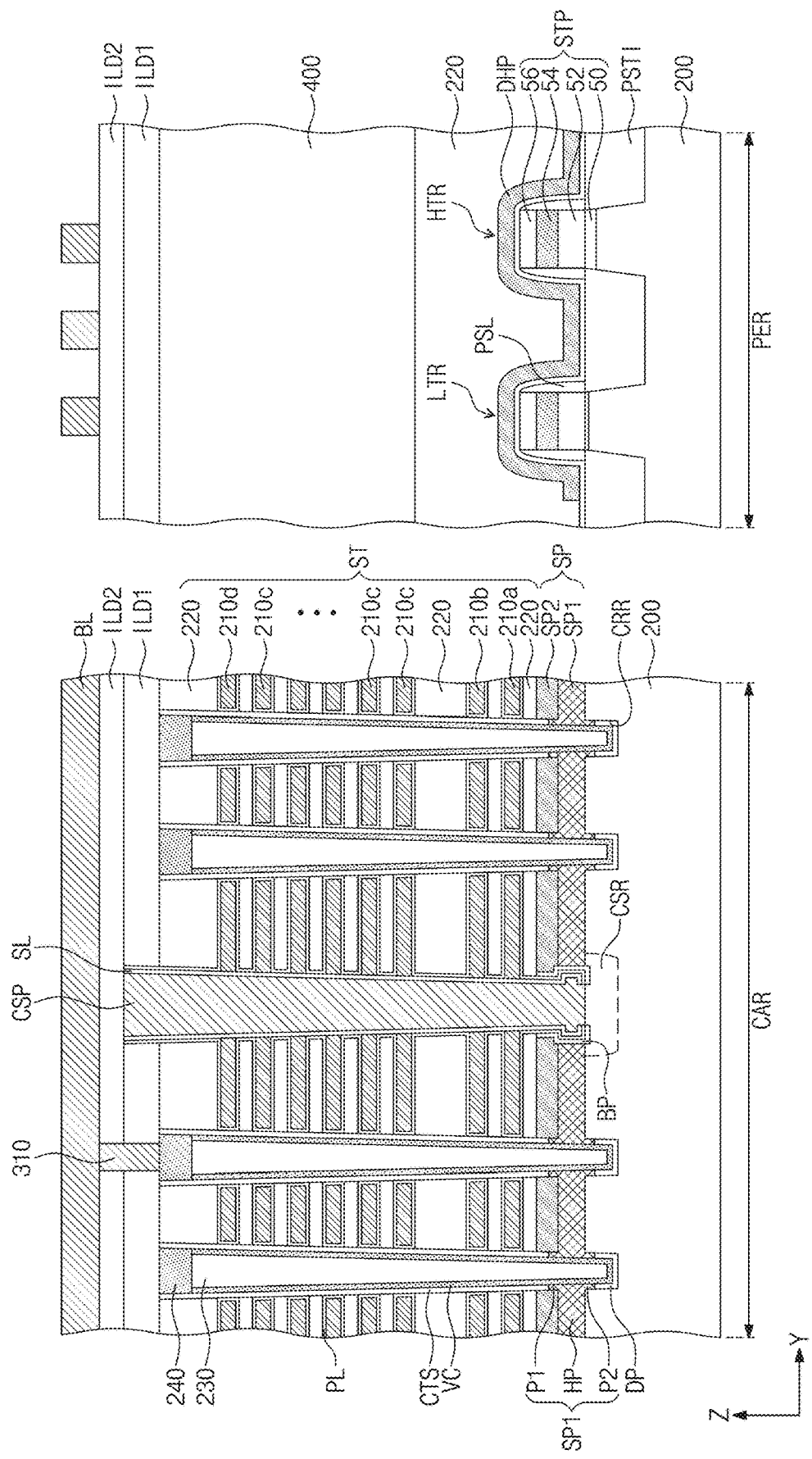
FIG. 6 is a sectional view illustrating a three-dimensional semiconductor memory device according to an embodiment of the inventive concepts.

FIG. 6 is a sectional view illustrating a three-dimensional semiconductor memory device according to an embodiment of the inventive concepts.

Referring to FIG. 6, the lower substrate 100 and the peripheral circuit structure PRS described with reference to FIG. 2 may be omitted from in a three-dimensional semiconductor memory device according to an embodiment of the inventive concepts. The substrate 200 may be a silicon substrate, a silicon-germanium substrate, a germanium substrate, or a single-crystalline epitaxial layer grown on a single-crystalline silicon substrate. The substrate 200 may be formed of a single crystalline semiconductor material (e.g., single crystalline silicon). The substrate 200 may include a cell array region CAR and a peripheral circuit region PER. The stacks ST and the source structure SP may be on the cell array region CAR of the substrate 200. The stacks ST and the source structure SP may expose the peripheral circuit region PER of the substrate 200.

A peripheral device isolation layer PSTI may be in the peripheral circuit region PER of the substrate 200 to define active regions of the substrate 200. A low voltage transistor LTR and a high voltage transistor HTR may be in the peripheral circuit region PER and on the active regions of the substrate 200. Each of the low and high voltage transistors LTR and HTR may include source/drain regions (not illustrated) formed in each of the active regions, and a stacked pattern STP. The source/drain regions may be formed in portions of the active region at both sides of the stacked pattern STP. The stacked pattern STP may include a peripheral gate insulating layer 50, a doped peripheral polysilicon pattern 52, a gate metal pattern 54, and a mask pattern 56 sequentially stacked on the substrate 200. Peripheral spacers PSL may be provided to cover side surfaces of the stacked pattern STP. A dummy sacrificial pattern DHP may be provided to conformally cover the side surfaces of the peripheral spacers PSL, top surfaces of the stacked patterns STP, and a top surface of the peripheral device isolation layer PSTI. The dummy sacrificial pattern DHP may be formed of or include a silicon nitride layer.

In an embodiment, the insulating pattern 220, which is on the cell array region CAR of the substrate 200 and between the lowermost electrode of the cell gate electrodes 210c and the ground selection gate electrode 210b, may be extended to the peripheral circuit region PER of the substrate 200 to cover the peripheral circuit region PER of the substrate 200 and the dummy sacrificial pattern DHP. An interlayered insulating pattern 400 may be on the insulating pattern 220 in the peripheral circuit region PER of the substrate 200.

FIGS. 7A to 7K are sectional views, each of which is taken along a line I-I' of FIG. 2 illustrating a method of fabricating a three-dimensional semiconductor memory device according to an embodiment of the inventive concepts.

Figure 7A:
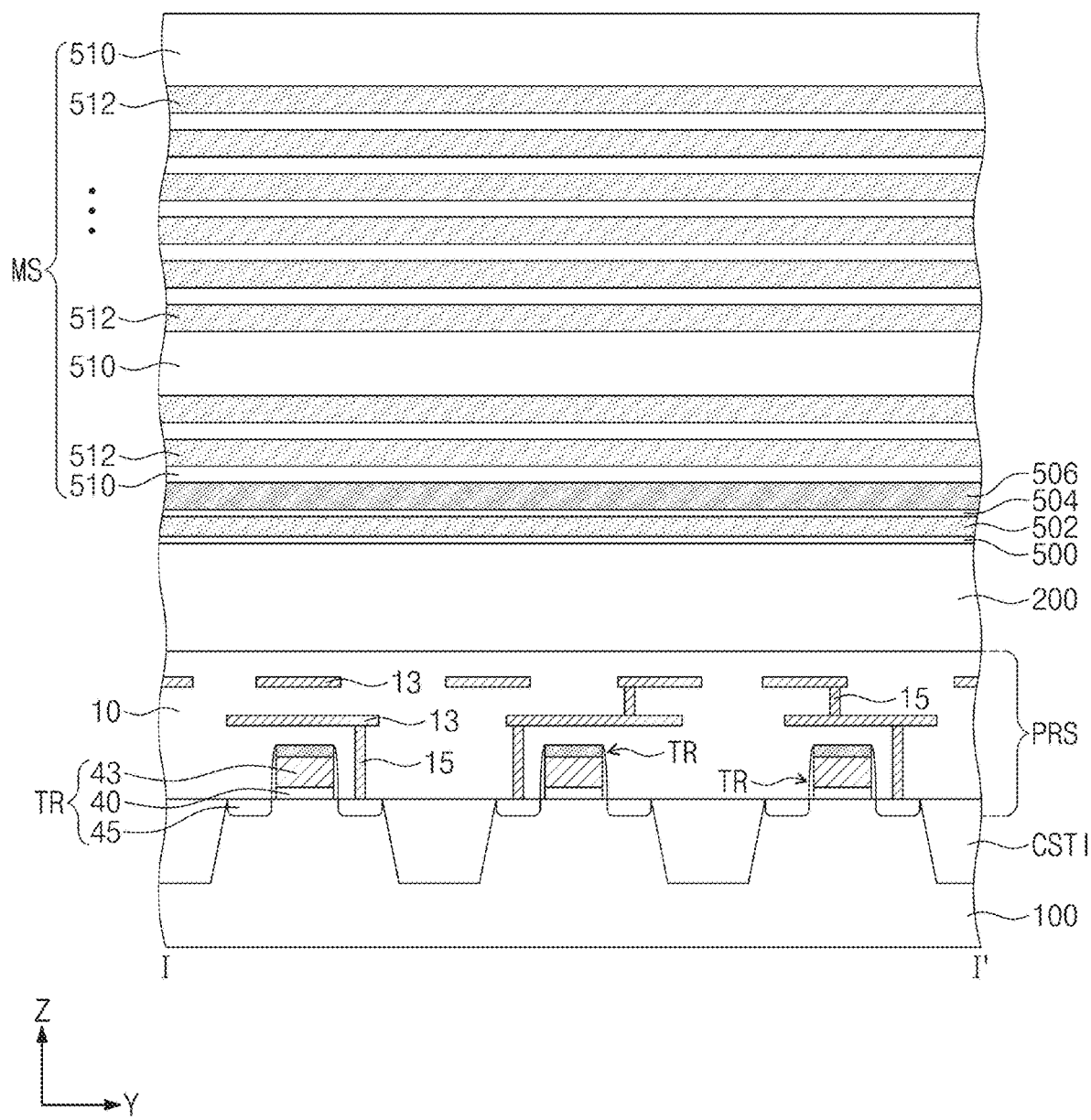
FIGS. 7A to 7K are sectional views, each of which is taken along a line I-I' of FIG. 2 illustrating a method of fabricating a three-dimensional semiconductor memory device according to an embodiment of the inventive concepts.

Referring to FIG. 7A, the cell device isolation layer CSTI may be provided in the lower substrate 100. The lower substrate 100 may be a silicon substrate, a silicon-germanium substrate, a germanium substrate, or a single-crystalline epitaxial layer grown on a single-crystalline silicon substrate. The lower substrate 100 may be formed of a single crystalline semiconductor material (e.g., single crystalline silicon). The cell device isolation layer CSTI may define active regions of the lower substrate 100. The peripheral circuit structure PRS may be provided on the lower substrate 100. The peripheral circuit structure PRS may include the peripheral circuit transistors TR, the interconnection lines 13, the vias 15, and the peripheral circuit interlayered insulating layer 10. The peripheral circuit transistors TR may be formed on the active regions of the lower substrate 100. Each of the peripheral circuit transistors TR may include the peripheral gate insulating layer 40, the peripheral gate electrode 43, and the source/drain regions 45. The peripheral circuit interlayered insulating layer 10 may be formed on the lower substrate 100. The peripheral circuit interlayered insulating layer 10 may be formed to cover the peripheral circuit transistors TR. The interconnection lines 13 and the vias 15 may be formed in the peripheral circuit interlayered insulating layer 10.

The substrate 200 may be on the peripheral circuit structure PRS. The substrate 200 may be formed of or include at least one of silicon, silicon-germanium, or germanium. In an embodiment, the substrate 200 may be formed of a polycrystalline semiconductor material (e.g., poly silicon). The substrate 200 may be doped with n-type impurities (e.g., phosphorus). A first buffer insulating layer 500, a first sacrificial layer 502, a second buffer insulating layer 504, and a source conductive layer 506 may be sequentially formed on the substrate 200. The first buffer insulating layer 500 may be on the substrate 200. The first buffer insulating layer 500 may include a thermal oxide layer or a silicon oxide layer. The first sacrificial layer 502 may be on the first buffer insulating layer 500. The first sacrificial layer 502 may be formed of a material having an etch selectivity with respect to the first buffer insulating layer 500. For example, the first sacrificial layer 502 may be formed of or include at least one of silicon nitride, silicon oxynitride, silicon carbide, and/or silicon germanium. The second buffer insulating layer 504 may be formed on the first sacrificial layer 502. The second buffer insulating layer 504 may be formed of or include silicon oxide. The source conductive layer 506 may be formed on the second buffer insulating layer 504. As an example, the source conductive layer 506 may be a poly silicon layer doped with n-type impurities and/or carbon (C) atoms. As another example, the source conductive layer 506 may be a poly silicon layer doped with only n-type impurities. The source conductive layer 506 may be formed on the second buffer insulating layer 504 using a deposition process.

A mold structure MS may be formed on the source conductive layer 506. The mold structure MS may include insulating layers 510 and second sacrificial layers 512 alternately and repeatedly stacked on the source conductive layer 506. The insulating layers 510 and the second sacrificial layers 512 may include materials having an etch selectivity with respect to each other. For example, the insulating layers 510 may be formed of or include silicon oxide, and the second sacrificial layers 512 may be formed of or include at least one of silicon oxynitride, silicon carbide, and/or silicon germanium.

Figure 7B:
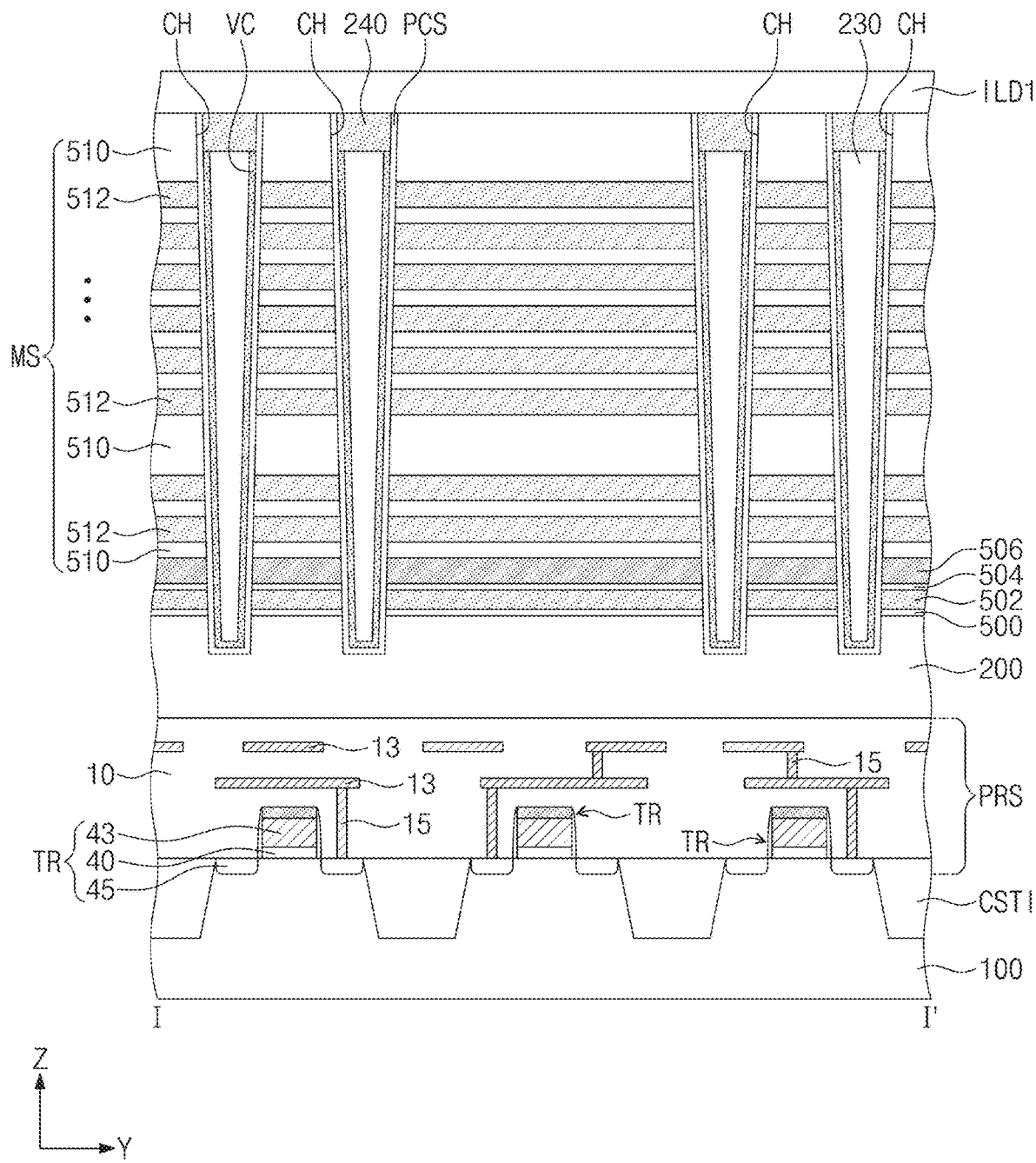

Referring to FIG. 7B, the mold structure MS, the source conductive layer 506, the second buffer insulating layer 504, the first sacrificial layer 502, and the first buffer insulating layer 500 may be etched to form channel holes CH exposing the substrate 200. For example, a mask pattern (not shown) may be formed on the uppermost layer of the insulating layers 510, and then, the mold structure MS, the source conductive layer 506, the second buffer insulating layer 504, the first sacrificial layer 502, and the first buffer insulating layer 500 may be anisotropically etched using the mask pattern as an etch mask. The etching process may be performed to recess portions of the top surface of the substrate 200 to a specific depth. The channel holes CH may have side surfaces inclined at an angle to the top surface of the substrate 200. The channel holes CH may have a circular, elliptical, or polygonal shape, when viewed in a plan view.

Preliminary structures PCS may be formed in the channel holes CH. The preliminary structures PCS may be formed to conformally cover the side and bottom surfaces of the channel holes CH. In an embodiment, similar to the charge storing structure CTS shown in FIG. 4B, the preliminary structures PCS may include the blocking insulating layer BLL, the charge storing layer CTL, and the tunnel insulating layer TL sequentially stacked on the side and bottom surface of the channel holes CH. The vertical channel portions VC may be formed in the channel holes CH, in which the preliminary structures PCS are formed. The vertical channel portions VC may be formed to conformally cover the side and bottom surfaces of the preliminary structures PCS. The gap-fill layers 230 may be formed in internal spaces of the vertical channel portions VC. The gap-fill layers 230 may be formed to completely fill the channel holes CH. The pads 240 may be formed in upper regions of the channel holes CH. The formation of the pads 240 may include etching upper portions of the vertical channel portions VC and upper portions of the gap-fill layers 230 to form recess regions and filling the recess regions with a conductive material. Alternatively, the pads 240 may be formed by doping upper portions of the vertical channel portions VC with impurities whose conductivity type is different from that of the vertical channel portions VC.

The first interlayered insulating layer ILD1 may be formed on the mold structure MS. The first interlayered insulating layer ILD1 may cover a top surface of the mold structure MS, top surfaces of the pads 240, and top surfaces of the preliminary structures PCS.

Figure 7C:
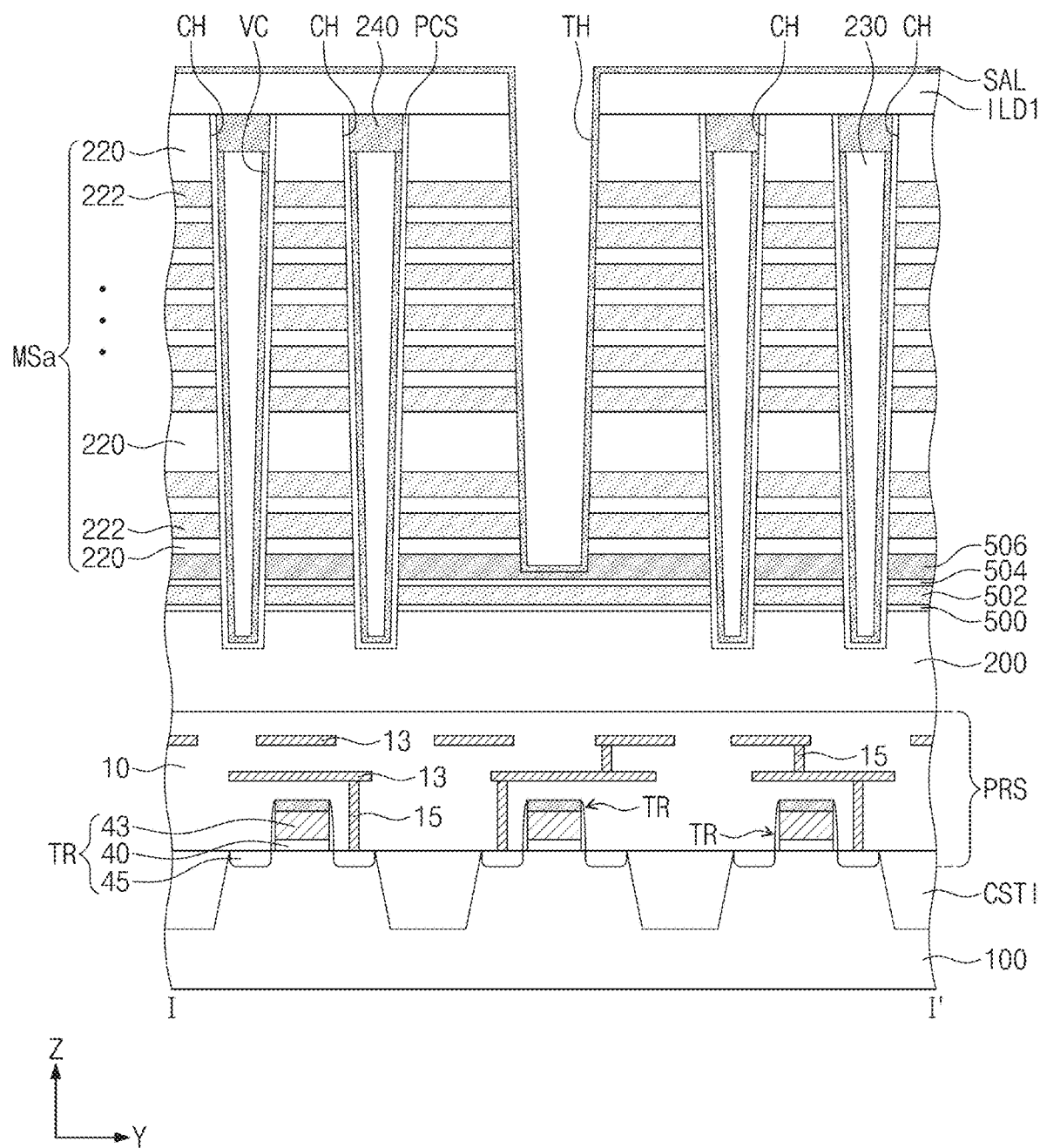

Referring to FIG. 7C, an anisotropic etching process may be performed to etch the mold structure MS and a portion of the source conductive layer 506, and here, the first interlayered insulating layer ILD1 may be used as an etch mask in the anisotropic etching process. As a result of the anisotropic etching process, a trench TH may be formed to penetrate the mold structure MS. The trench TH may also be formed in the portion of the source conductive layer 506. A bottom surface of the trench TH may be positioned at a level between top and bottom surfaces of the source conductive layer 506. Due to the trench TH, the mold structure MS may be divided into a plurality of mold structures MSa spaced apart from each other in the second direction Y. Each of the mold structures MSa may include the insulating patterns 220 and second sacrificial patterns 222 alternately stacked on the source conductive layer 506. The trench TH may be formed to expose a side surface of the first interlayered insulating layer ILD1, side surfaces of the insulating patterns 220, side surfaces of the second sacrificial patterns 222, and a portion of the recessed top surface of the source conductive layer 506.

A protection layer SAL may be formed to conformally cover side and bottom surfaces of the trench TH and a top surface of the first interlayered insulating layer ILD1. The protection layer SAL may be formed of or include a material having an etch selectivity with respect to the mold structures MSa and the first sacrificial layer 502. For example, the protection layer SAL may be formed of or include poly silicon. The protection layer SAL may be formed by a deposition process.

Figure 7D:
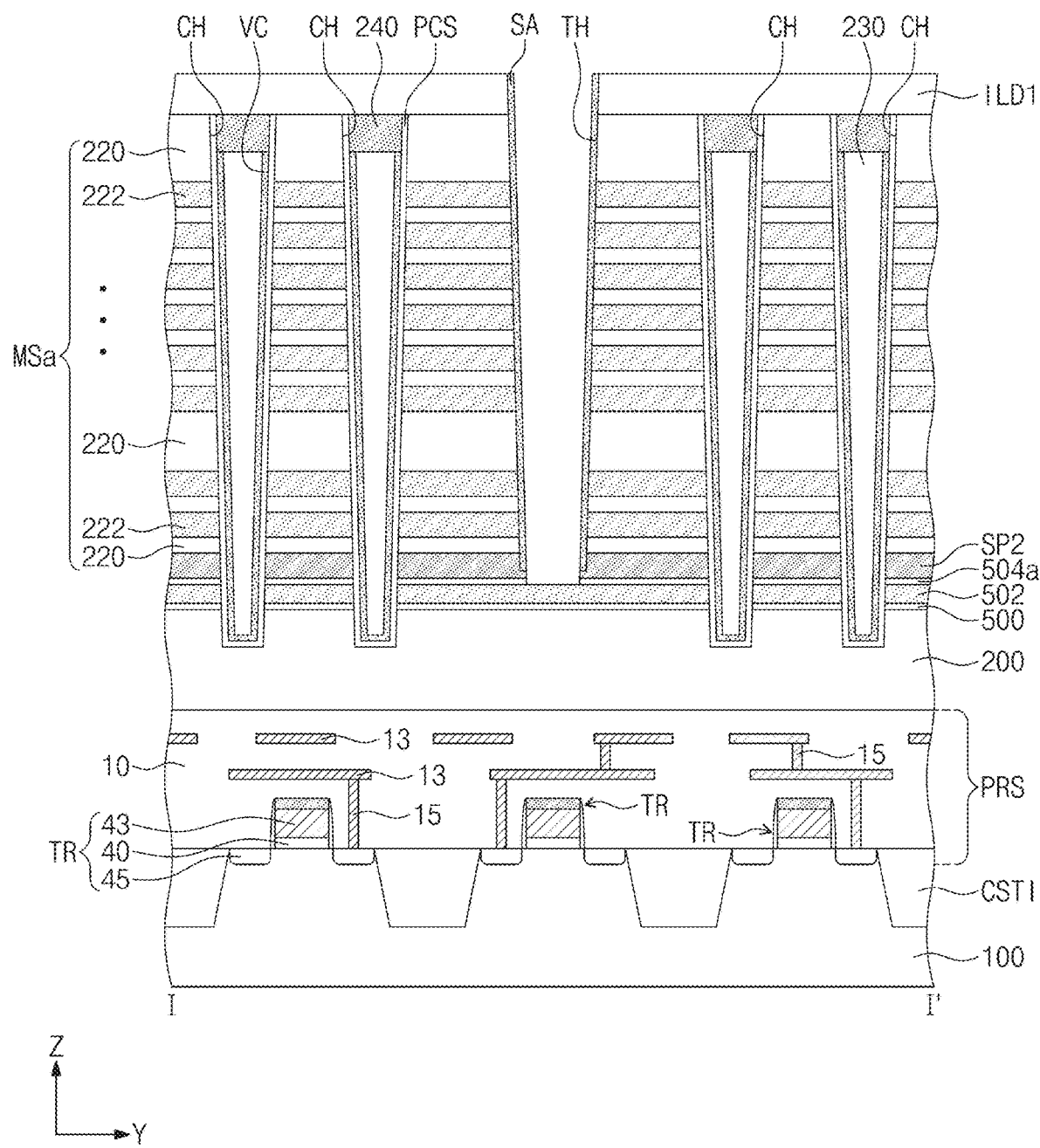

Referring to FIG. 7D, an anisotropic etching process may be performed on the protection layer SAL to form protection spacers SA. The protection spacers SA may be formed to cover the side surfaces of the trench TH. The source conductive layer 506 and the second buffer insulating layer 504 below the trench TH may be etched during the anisotropic etching process. Accordingly, a portion of a top surface of the first sacrificial layer 502 may be exposed through the trench TH. As a result of the etching of the source conductive layer 506 and the second buffer insulating layer 504, the source conductive layer 506 may be divided into a plurality of the second source conductive patterns SP2 spaced apart from each other in the second direction Y, and the second buffer insulating layer 504 may be divided into a plurality of second buffer insulating patterns 504a spaced apart from each other in the second direction Y.

Figure 7E:
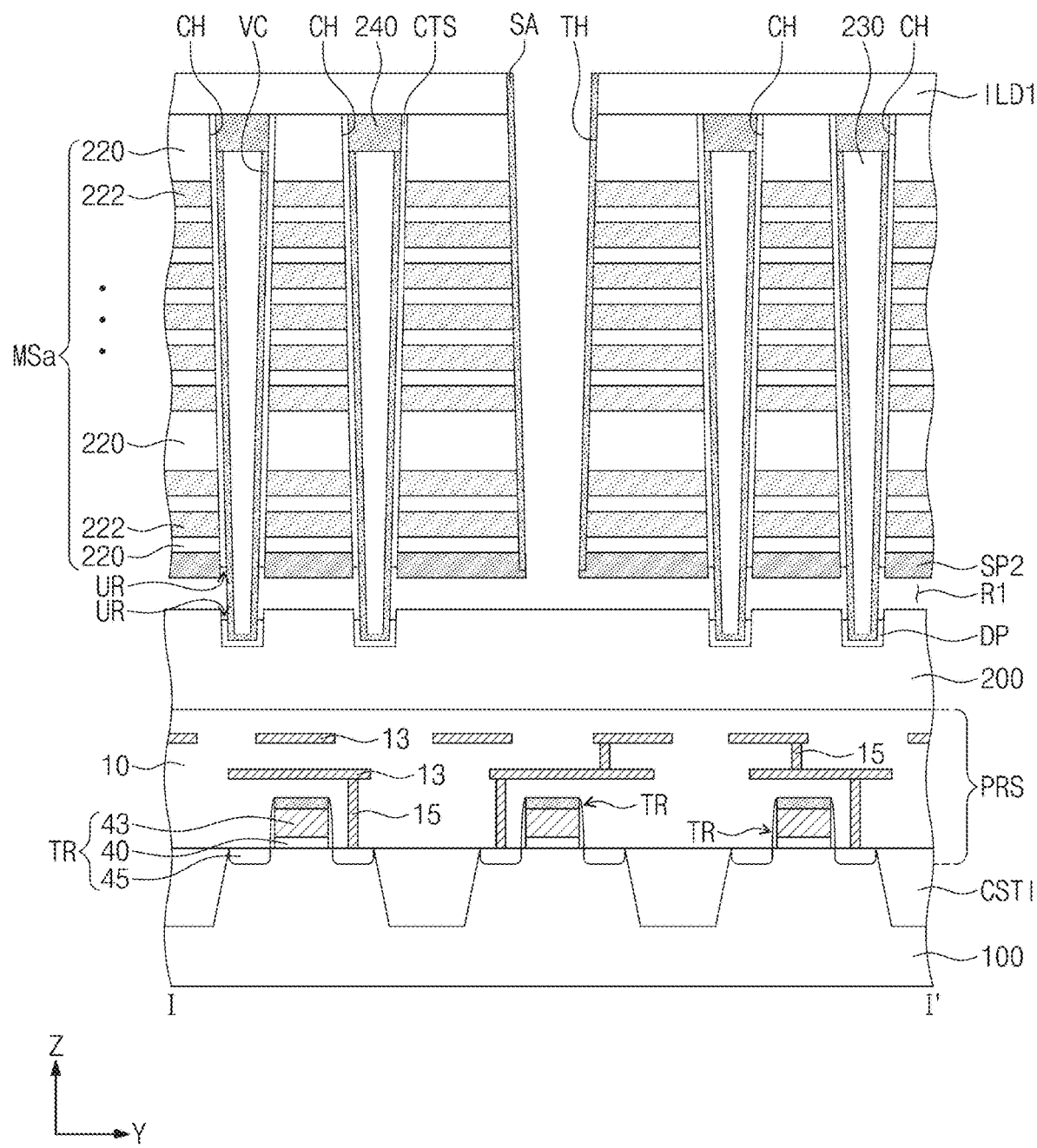

Referring to FIG. 7E, the first sacrificial layer 502 exposed through the trench TH may be removed to form a first recess region R1. The formation of the first recess region R1 may include selectively removing the first sacrificial layer 502 exposed through the trench TH to expose a top surface of the first buffer insulating layer 500, bottom surfaces of the second buffer insulating patterns 504a, and portions of the preliminary structures PCS. The first sacrificial layer 502 may be removed by an isotropic etching process using an etching solution, which is chosen to have an etch selectivity with respect to the protection spacers SA, the second source conductive patterns SP2, the second buffer insulating patterns 504a, and the first buffer insulating layer 500. The process of etching the first sacrificial layer 502 may be performed using an etching solution, in which phosphoric acid is contained.

Portions of the preliminary structure PCS exposed by the first recess region R1 may be etched to from the charge storing structures CTS and the dummy patterns DP. The portions of the preliminary structures PCS may be isotropically removed by supplying an etching solution to the preliminary structures PCS through the first recess region R1. Accordingly, the outer side surfaces of the vertical channel portions VC may be exposed between the substrate 200 and the second source conductive patterns SP2. The first buffer insulating layer 500 and the second buffer insulating patterns 504a may also be removed during the etching of the portions of the preliminary structures PCS. In this case, bottom surfaces of the second source conductive patterns SP2 may be exposed through the first recess region R1. Due to the isotropic etching process, undercut regions UR may be formed between the outer side surfaces of the vertical channel portions VC and the side surfaces of the second source conductive patterns SP2 and between the side surfaces of the vertical channel portions VC and the side surfaces of the channel holes CH in the substrate 200. The first recess region R1 may be an empty space, which is horizontally extended from the trench TH into a region between the second source conductive patterns SP2 and the substrate 200. The undercut regions UR may be empty spaces extended from the first recess region R1 in the third direction Z.

The isotropic etching process on the preliminary structures PCS may include sequentially etching the blocking insulating layer BLL (as disclosed in reference with FIG. 4B), the charge storing layer CTL (as disclosed in reference with FIG. 4B), and the tunnel insulating layer TL (as disclosed in reference with FIG. 4B) through the first recess region R1. For example, the isotropic etching process may include sequentially performing a first etching process of etching a portion of the blocking insulating layer BLL, a second etching process of etching a portion of the charge storing layer CTL, and a third etching process of etching a portion of the tunnel insulating layer TL. In this case, an etching solution containing hydrofluoric and/or sulfuric acid may be used in the first and third etching processes, and an etching solution containing phosphoric acid may be used in the second etching process.

The charge storing structures CTS and the dummy patterns DP may be patterns that are formed by dividing the preliminary structures PCS in the third direction Z through the isotropic etching process. The charge storing structures CTS may enclose the outer side surfaces of the vertical channel portions VC, located above the bottom surfaces of the second source conductive patterns SP2, and the dummy patterns DP may enclose the side and bottom surfaces of the vertical channel portions VC located below the top surface of the substrate 200.

Figure 7F:
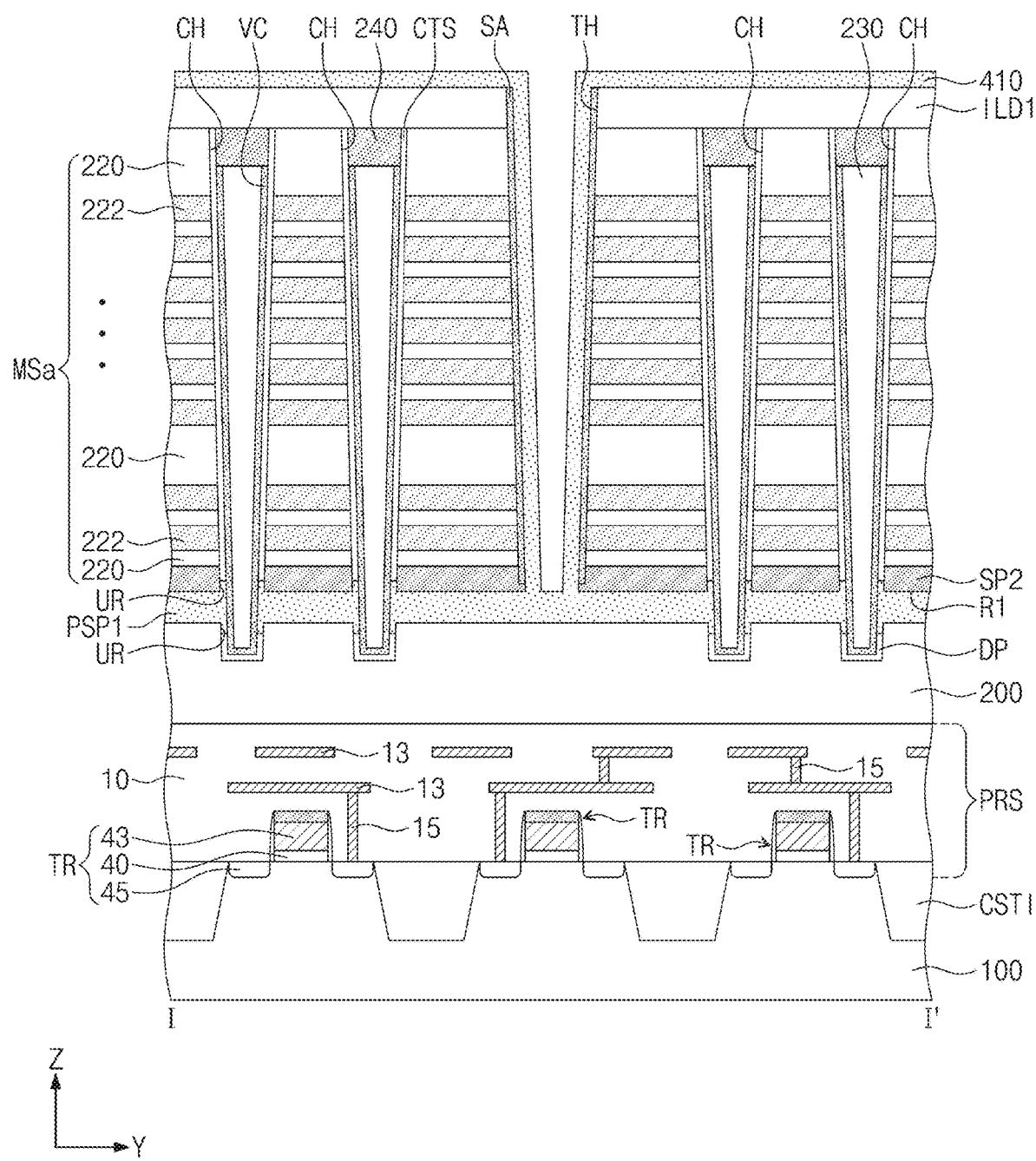

Referring to FIG. 7F, a preliminary source conductive layer 410 may be formed in the first recess region R1 and the undercut regions UR. The preliminary source conductive layer 410 may be formed to cover the top surface of the first interlayered insulating layer ILD1 and the side surfaces of the protection spacers SA and to completely fill the first recess region R1 and the undercut regions UR. The preliminary source conductive layer 410 may be formed by a deposition process. The preliminary source conductive layer 410 may be formed of or include an amorphous semiconductor material (e.g., amorphous silicon).

In an embodiment, the preliminary source conductive layer 410 may be doped with first impurities by depositing the preliminary source conductive layer 410 in an in-situ manner. The first impurities may be n-type impurities (e.g., phosphorus). In certain embodiments, the preliminary source conductive layer 410 may be doped with first and second impurities by depositing the preliminary source conductive layer 410 in an in-situ manner. The first impurities may be n-type impurities (e.g., phosphorus), and the second impurities may be elements suppressing the growth of crystal grains of the preliminary source conductive layer 410 in a subsequent annealing process for crystallization. The second impurities may include at least one of, for example, carbon (C), nitrogen (N), oxygen (O), chlorine (Cl), and/or bromine (Br). In an embodiment, the second impurities may be doped in the preliminary source conductive layer 410 such that the number of atoms per unit area is smaller than about 10%. The first impurities and/or the second impurities may be doped in the preliminary source conductive layer 410 through an additional injection process, which is performed after the deposition of the preliminary source conductive layer 410. In this case, the injection process may be an ion implantation process or a gas phase doping process.

Figure 7G:
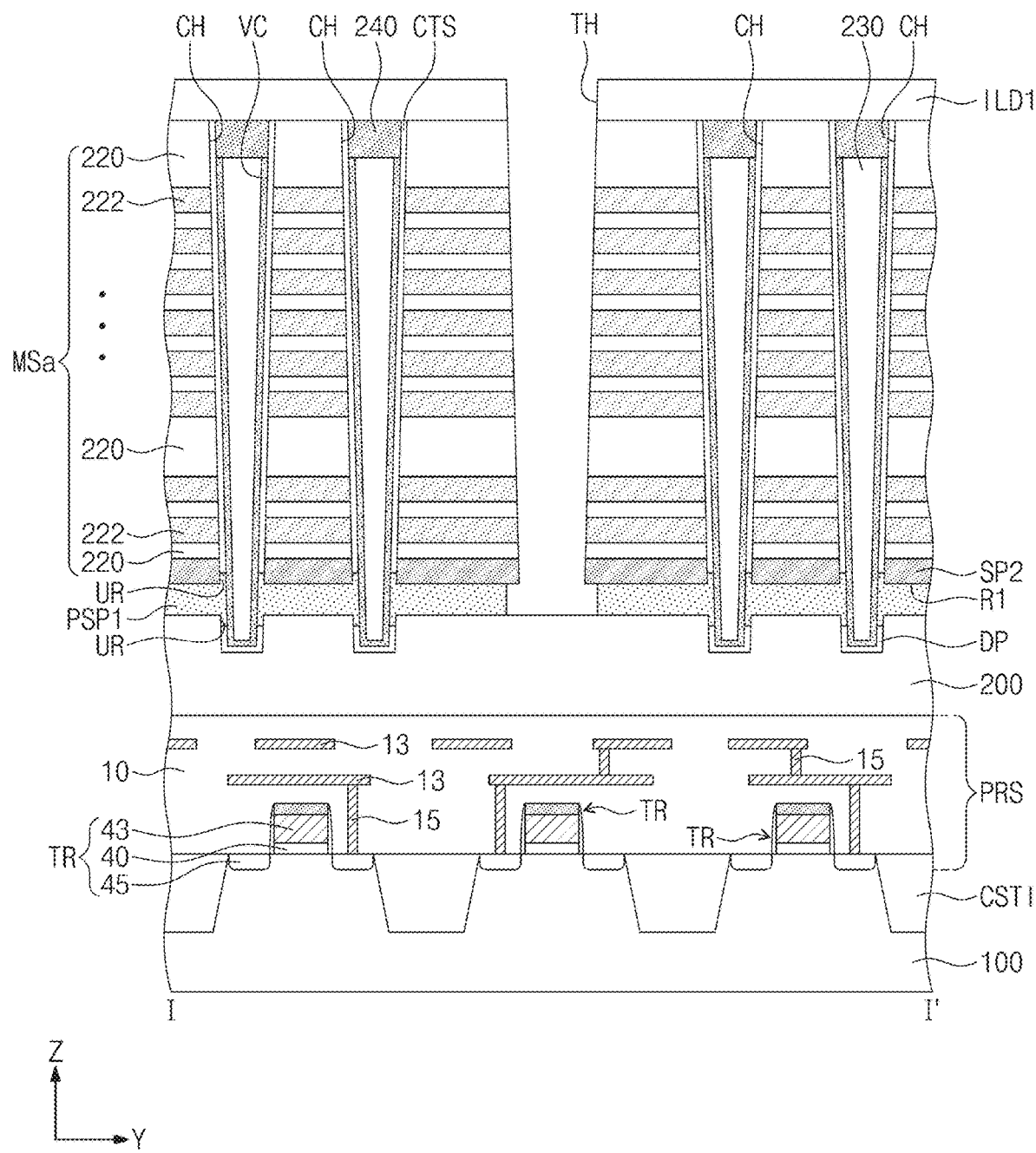

Referring to FIG. 7G, an isotropic etching process etching a portion of the preliminary source conductive layer 410 may be performed to locally form preliminary source conductive patterns PSP1 in the first recess region R1. The isotropic etching process may include etching the preliminary source conductive layer 410 formed on the side surfaces of the protection spacers SA, the top surface of the first interlayered insulating layer ILD1, and the top surface of the substrate 200 below the trench TH. The protection spacers SA may also be etched during the isotropic etching process. Accordingly, the side surfaces of the mold structures MSa may be etched. Due to the isotropic etching process, the side surfaces of the preliminary source conductive patterns PSP1 may not be aligned to the side surfaces of the trench TH. For example, a width between the second source conductive patterns SP2 adjacent to each other in the second direction Y in the trench TH, may be smaller than a width between the preliminary source conductive patterns PSP1 adjacent to each other in the second direction Y. The isotropic etching process may be performed using an etch recipe having an etch selectivity with respect to the mold structures MSa. The isotropic etching process may be performed by a wet etching process using a mixture solution (e.g., standard clean 1 (SC1)) containing deionized water, ammonia ($NH_4OH$), peroxide, potassium hydroxide (KOH), and/or ethylenediamine pyrocatechol (EDP).

Figure 7H:
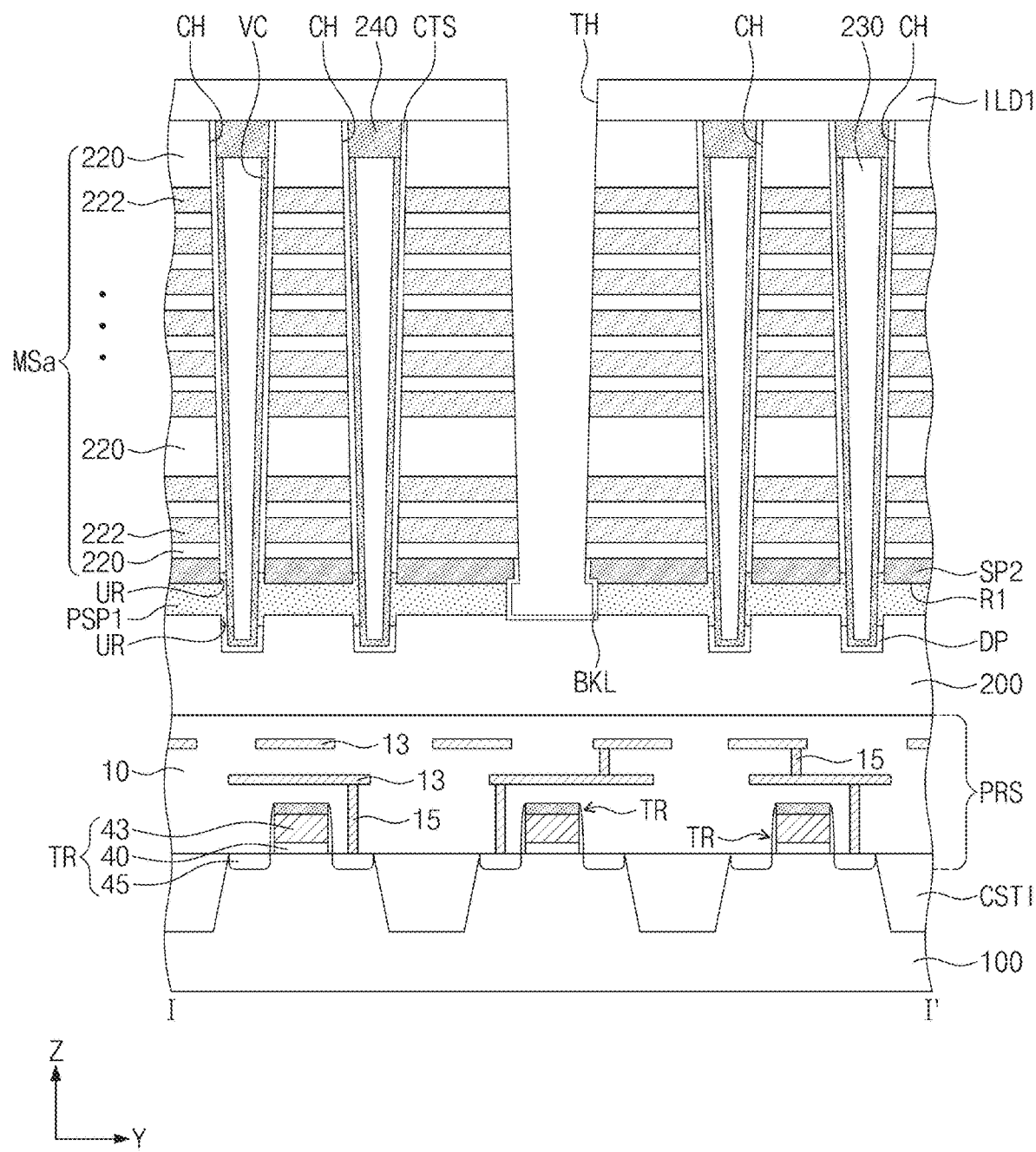

Referring to FIG. 7H, a blocking layer BKL may be formed on the side surfaces of the second source conductive patterns SP2, the side surfaces of the preliminary source conductive patterns PSP1, and a portion of the top surface of the substrate 200 exposed through the trench TH. The blocking layer BKL may be formed by an oxidation process of oxidizing the side surfaces of the second source conductive patterns SP2, the side surfaces of the preliminary source conductive patterns PSP1, and the portion of the top surface of the substrate 200 exposed through the trench TH. The oxidation process may be performed at a temperature ranging from about 300° C. to about 600° C. During the oxidation process, the preliminary source conductive patterns PSP1 may be maintained at the amorphous state. The oxidation process may be a thermal oxidation process, a wet oxidation process, or a dry oxidation process. The blocking layer BKL may be formed of or include, for example, silicon oxide. The blocking layer BKL may reduce or prevent damaging the substrate 200, the second source conductive patterns SP2, and the preliminary source conductive patterns PSP1 exposed through the trench TH, during a subsequent process.

Figure 7I:
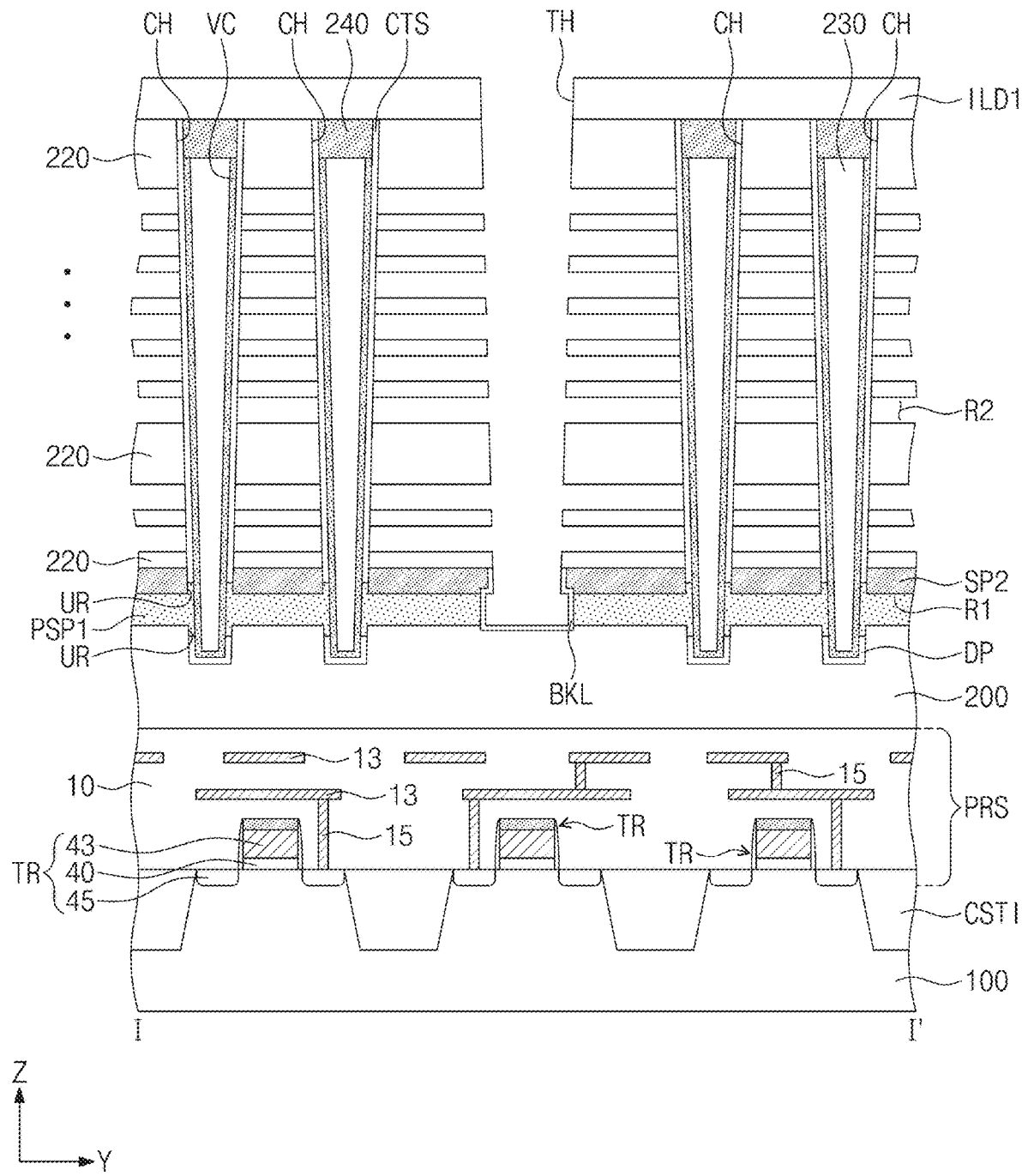

Referring to FIG. 7I, the second sacrificial patterns 222 exposed through the trenches TH may be selectively removed to form second recess regions R2 between the insulating patterns 220 spaced apart from each other in the third direction Z. The second recess regions R2 may be formed by a wet etching process and/or an isotropic dry etching process of removing the second sacrificial patterns 222. Since the insulating patterns 220 includes a material having an etch selectivity with respect to the second sacrificial patterns 222, the insulating patterns 220 may not be removed when the second sacrificial patterns 222 are removed. In addition, the blocking layer BKL may not be removed when the second sacrificial patterns 222 are removed. The selective removal of the second sacrificial patterns 222 may be performed by an etching process, for example by applying an etching solution containing phosphoric acid. The second recess regions R2 may be horizontally extended from the trench TH into regions between the insulating patterns 220. Top and bottom surfaces of the insulating patterns 220 and portions of outer side surfaces of the charge storing structures CTS may be exposed through the second recess regions R2. After the formation of the second recess regions R2, a curing process may be performed to repair the damage on the surfaces of the insulating patterns 220.

Figure 7J:
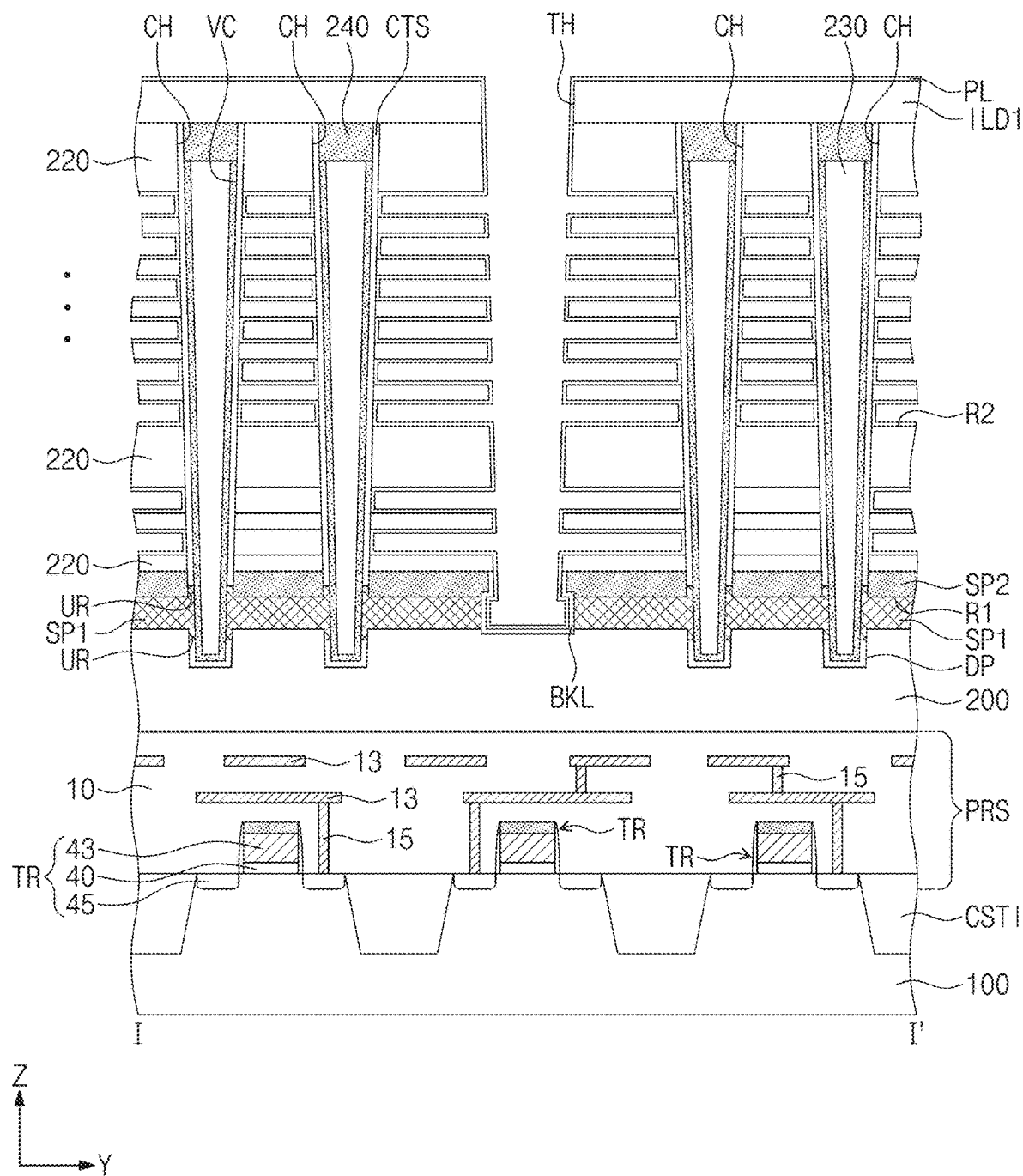

Referring to FIG. 7J, the horizontal insulating layer PL may be formed to cover surfaces of the layers exposed by the second recess regions R2 and the trench TH. For example, the horizontal insulating layer PL may be formed to conformally cover the surfaces of the insulating patterns 220, portions of the outer side surfaces of the charge storing structures CTS exposed through the second recess regions R2, the side and bottom surfaces of the blocking layer BKL, and the top and side surfaces of the first interlayered insulating layer ILD1. The horizontal insulating layer PL may be formed by a deposition method having a good step-coverage property. For example, the horizontal insulating layer PL may be formed by a chemical vapor deposition (CVD) process or an atomic layer deposition (ALD) process. The horizontal insulating layer PL may be formed of or include at least one of silicon oxide (e.g., $SiO_2$) and/or a high-k dielectric material (e.g., aluminum oxide ($Al_2O_3$) and/or hafnium oxide ($HfO_2$)).

After the formation of the horizontal insulating layer PL, a thermal treatment process may be performed to crystalize the preliminary source conductive patterns PSP1. The thermal treatment process may crystallize the amorphous structure of the preliminary source conductive patterns PSP1 to form a polycrystalline structure in the first source conductive patterns SP1 in a short time. In an embodiment, the thermal treatment process may be performed by a rapid thermal annealing (RTA) process. The RTA process may be performed at a temperature of about 600° C. or higher for a process time from about 30 seconds to about 1 minute. The size of the crystal grains may be proportional to the process time of the thermal treatment process. For example, the shorter the process time of the thermal treatment process, the smaller the size of the crystal grains, and the longer the process time of the thermal treatment process, the larger the size of the crystal grains. In an embodiment, the first source conductive patterns SP1 may be formed such that the crystal grains GS1 (e.g., see FIG. 4A) thereof have a small grain size. For example, the grain size of the crystal grains GS1 of the first source conductive patterns SP1 may be formed to be smaller than the grain size of the crystal grains GS2 (e.g., see FIG. 4A) of the substrate 200. In addition, the grain size of the crystal grains GS1 of the first source conductive patterns SP1 may be formed to be smaller than the grain size of the crystal grains GS3 (e.g., see FIG. 4A) of the second source conductive patterns SP2.

In an embodiment, the grain size of the crystal grains of the first source conductive patterns SP1 including the second impurities (e.g., non-conductive impurities) may be smaller than the grain size of the crystal grains of the first source conductive patterns SP1 in an embodiment in which the second impurities were not included. For example, the second impurities may be used to suppress the grain growth of the crystal grains of the first source conductive patterns SP1.

If the crystal grains GS1 of the first source conductive patterns SP1 are formed to have a small grain size, the number of the grain boundaries of the first source conductive patterns SP1 may be increased. According to an embodiment of the inventive concepts, by reducing the grain size of the crystal grains GS1 of the first source conductive patterns SP1, it may be possible to increase the amount of the first impurities (e.g., phosphorus) in the first source conductive patterns SP1 and the amount of the impurities doped in the substrate 200. For example, the interdiffusion of the impurities from the first source conductive patterns SP1 and the substrate 200 to the vertical channel portions VC, would be hindered by the segregation of the impurities at the grain boundaries of the first source conductive patterns SP1. Accordingly, it may be possible to hinder or prevent the impurities from being diffused into the vertical channel portions VC.

Figure 7K:
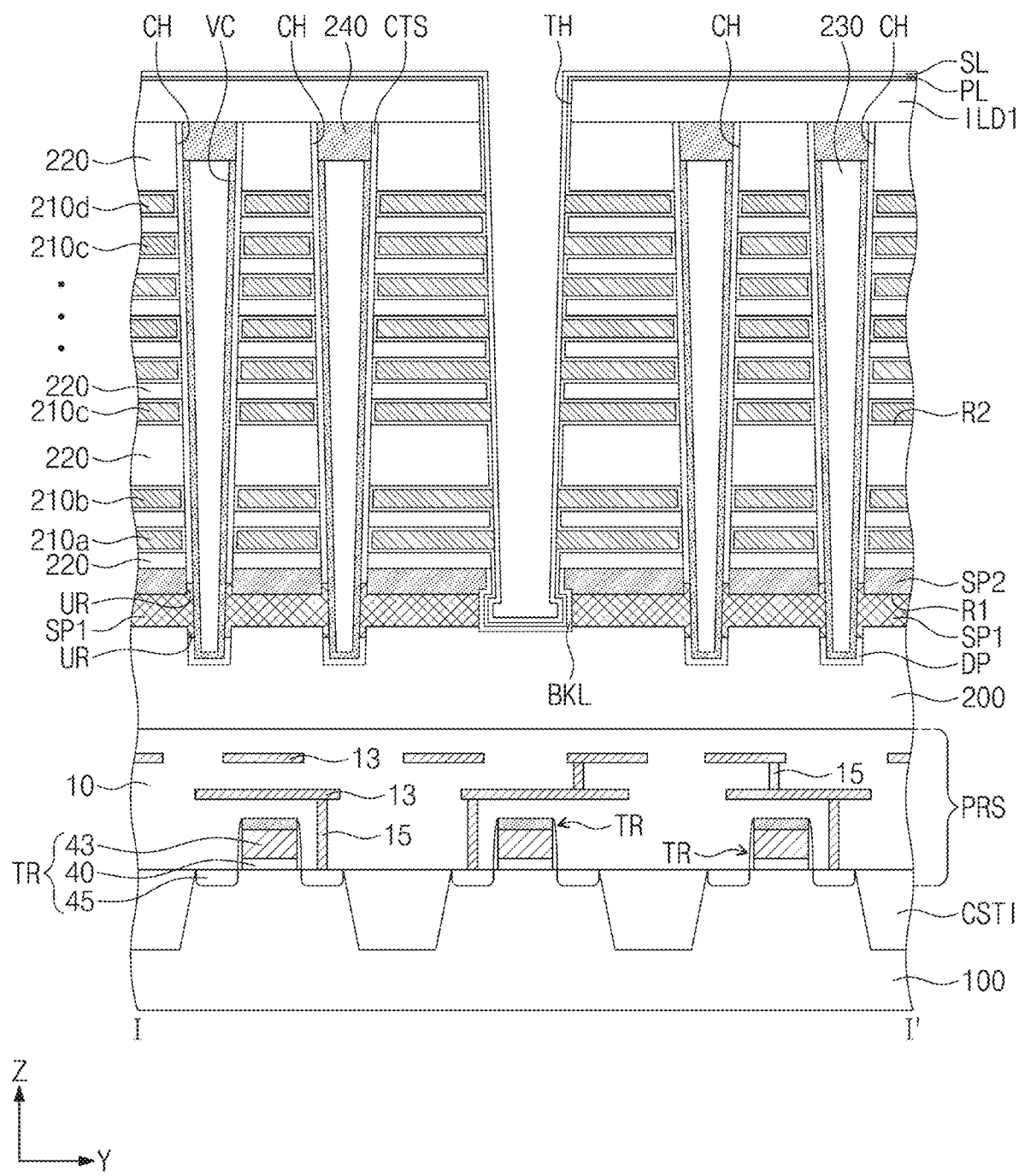

Referring to FIG. 7K, the gate electrodes 210a, 210b, 210c, and 210d may be formed by filling the second recess regions R2 with a conductive material. The formation of the gate electrodes 210a, 210b, 210c, and 210d may include forming a conductive layer (not shown) to fill the second recess regions R2 and performing an etching process to remove the conductive layer in the trench TH and to locally leave the conductive layer in the second recess regions R2. After the formation of the gate electrodes 210a, 210b, 210c, and 210d, the spacer SL may be conformally formed on the side surfaces of the horizontal insulating layer PL, the first interlayered insulating layer ILD1, and the gate electrodes 210a, 210b, 210c, and 210d at the side of the trench TH, on the horizontal insulating layer PL at the bottom surface of the trench TH, and on the top surface of the first interlayered insulating layer ILD1. The spacer SL may be formed of or include at least one of an insulating material (e.g., silicon oxide and/or silicon nitride).

Referring back to FIGS. 3 and 4C, an anisotropic etching process may be performed to etch a portion of the blocking layer BKL, a portion of the horizontal insulating layer PL, and a portion of the spacer SL to expose the top surface of the substrate 200 below the trench TH. The blocking pattern BP may be formed by etching a portion of the blocking layer BKL and may be formed to cover the side surfaces of the first and second source conductive patterns SP1 and SP2 and to expose a portion of the top surface of the substrate 200 below the trench TH. During the anisotropic etching process to expose the top surface of the substrate 200 below the trench TH, a portion of the horizontal insulating layer PL and a portion of the spacer SL on the top surface of the first interlayered insulating layer ILD1, may also be etched to expose the top surface of the first interlayered insulating layer ILD1.

The common source region CSR may be formed in the substrate 200 below the trench TH. The common source region CSR may be formed by an ion implantation process. The common source region CSR may be formed to have a different conductivity type from the substrate 200. The common source pattern CSP may be formed in the trench TH. The common source pattern CSP may be electrically connected to the common source region CSR. The common source pattern CSP may be formed of or include at least one of a conductive material (e.g., tungsten, copper, and/or aluminum) or metal nitrides (e.g., titanium nitride and/or tantalum nitride).

The second interlayered insulating layer ILD2 may be formed on the first interlayered insulating layer ILD1. The second interlayered insulating layer ILD2 may be formed to cover the top surface of the first interlayered insulating layer ILD1 and the top surface of the common source pattern CSP. The channel contact plugs 310 may be on the pads 240. The channel contact plugs 310 may penetrate the first and second interlayered insulating layers ILD1 and ILD2 and may be electrically connected to the pads 240. The bit lines BL may be formed on the second interlayered insulating layer ILD2. The bit lines BL may be formed to extend in the second direction Y. The bit lines BL may be electrically connected to the channel contact plugs 310.

According to an embodiment of the inventive concepts, it may be possible to reduce a grain size of crystal grains of a first source conductive pattern that is in contact with a vertical channel portion. In this case, more grain boundaries may be formed in the first source conductive pattern, and impurities doped in the first source conductive pattern and a substrate may be segregated in the grain boundaries. Accordingly, it may be possible to prevent or suppress the impurities from being diffused into the vertical channel portion and thereby to improve electric and reliability characteristics of a three-dimensional semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
    a first source conductive pattern comprising a polycrystalline material including first crystal grains; the first source conductive pattern on a substrate, the substrate comprising a polycrystalline material including second crystal grains, a grain size of the first crystal grains being smaller than a grain size of the second crystal grains;
    a stack including a plurality of gate electrodes, the plurality of gate electrodes stacked on the first source conductive pattern; and
    a vertical channel portion penetrating the stack and the first source conductive pattern, and the vertical channel portion being in contact with a side surface of the first source conductive pattern.

2. The device of claim 1, wherein the first source conductive pattern is in contact with a top surface of the substrate.

3. The device of claim 1, wherein a ratio of the grain size of the first crystal grains to the grain size of the second crystal grains ranges from 0.1 to 0.01.

4. The device of claim 1, wherein
the first source conductive pattern comprises first impurities and second impurities,
the first impurities comprising n-type impurities, and
the second impurities comprising crystal growth suppressing elements for suppression of crystal growth in the first crystal grains of the first source conductive pattern.

5. The device of claim 4, wherein the second impurities comprise at least one of carbon (C), nitrogen (N), oxygen (O), chlorine (Cl), or bromine (Br).

6. The device of claim 1, further comprising:
a charge storing layer interposed between the vertical channel portion and the stack,
wherein the charge storing layer is in contact with a portion of a top surface of the first source conductive pattern.

7. The device of claim 1, further comprising:
a second source conductive pattern between the first source conductive pattern and the stack; and
the first source conductive pattern comprises
a horizontal portion interposed between the substrate and the second source conductive pattern;
a first protruding portion extending from the horizontal portion and interposed between a portion of a side surface of the second source conductive pattern and a portion of an outer side surface of the vertical channel portion; and
a second protruding portion extending from the horizontal portion and interposed between a portion of the outer side surface of the vertical channel portion and a portion of a side surface of the substrate, wherein the vertical channel portion is extended into the substrate.

8. The device of claim 1, further comprising:
a channel recess region recessed from a top surface of the substrate;
a charge storing layer on the first source conductive pattern and enclosing a portion of an outer side surface of the vertical channel pattern; and
a dummy pattern in the channel recess region and enclosing a lower side surface and a bottom surface of the vertical channel pattern, the dummy pattern spaced apart from the charge storing layer,
wherein the vertical channel pattern extends into the channel recess region.

9. The device of claim 1, further comprising:
a second source conductive pattern between the first source conductive pattern and the stack, the second source conductive pattern comprising third crystal grains,
wherein a grain size of the third crystal grains is smaller than the grain size of the second crystal grains, and
the grain size of the third crystal grains is larger than the grain size of the first crystal grains.

10. The device of claim 1, wherein each of the substrate and the first source conductive pattern is formed of a semiconductor material.

11. The device of claim 1, further comprising:
a lower substrate below the substrate; and
a peripheral circuit structure between the lower substrate and the substrate,
wherein the peripheral circuit structure comprises peripheral circuit transistors.

12. The device of claim 1, further comprising:
an upper stack comprising a plurality of upper gate electrodes stacked on the stack,
wherein the vertical channel portion is extended from a top surface of the substrate in a vertical direction to penetrate the upper stack, and
a top width of a lower portion of the vertical channel portion penetrating the stack is larger than a bottom width of an upper portion of the vertical channel portion penetrating the upper stack.

13. The device of claim 1, further comprising:
a common source pattern on the substrate at a side of the stack and extending in a first direction.

14. A three-dimensional semiconductor memory device, comprising:
a first source conductive pattern and a second source conductive pattern on a substrate, the first source conductive pattern comprising impurities not included in the second source conductive pattern;
a stack including a plurality of gate electrodes stacked on the second source conductive pattern; and
a vertical channel portion penetrating the stack and the first and second source conductive patterns, and the vertical channel portion being in contact with a side surface of the first source conductive pattern.

15. The device of claim 14, wherein
the first source conductive pattern comprises first impurities and second impurities,
the first impurities comprise n-type impurities, and
the second impurities comprise at least one of carbon (C), nitrogen (N), oxygen (O), chlorine (Cl), or bromine (Br).

16. The device of claim 14, wherein
the first source conductive pattern has first crystal grains,
the substrate has second crystal grains, and
a ratio of a grain size of the first crystal grains to a grain size of the second crystal grains ranges from 0.1 to 0.01.

17. The device of claim 14, wherein
the substrate is formed of single crystalline silicon, and
the first source conductive pattern is formed of poly silicon.

18. A three-dimensional semiconductor memory device, comprising:
a peripheral circuit structure on a first substrate, the peripheral circuit structure including peripheral circuit transistors;
a second substrate on the peripheral circuit structure;
a first source conductive pattern on the second substrate, the first source conductive pattern comprising first impurities and second impurities, the first impurities including n-type impurities, the second impurities comprising crystal growth suppressing elements for suppression of crystal growth in the first source conductive pattern;
a stack including a plurality of gate electrodes stacked on the first source conductive pattern;
a vertical channel portion penetrating the stack and first source conductive pattern and extending into the second substrate, the vertical channel portion being in contact with a side surface of the first source conductive pattern; and
a charge storing layer interposed between the vertical channel portion and the stack.

19. The device of claim 18, further comprising:
a dummy pattern in the second substrate and enclosing a lower side surface and a bottom surface of the vertical channel portion,
wherein the dummy pattern comprises a same material as the charge storing layer.

20. The device of claim 18, wherein the n-type impurities comprise phosphorus (P), and
the second impurities comprise at least one of carbon (C), nitrogen (N), oxygen (O), chlorine (Cl), or bromine (Br).

* * * * *